(12) United States Patent
Yeh et al.

(10) Patent No.: US 12,369,474 B1
(45) Date of Patent: Jul. 22, 2025

(54) ORGANIC LIGHT-EMITTING DIODE DISPLAY WITH PASSIVE LEAKAGE-REDUCING STRUCTURES

(71) Applicant: Apple Inc., Cupertino, CA (US)

(72) Inventors: Po-Chun Yeh, Sunnyvale, CA (US); Jiun-Jye Chang, Cupertino, CA (US); Doh-Hyoung Lee, Campbell, CA (US); Caleb Coburn, San Jose, CA (US); Niva A. Ran, Palo Alto, CA (US); Ching-Sang Chuang, Sunnyvale, CA (US); Themistoklis Afentakis, San Jose, CA (US); Chuan-Jung Lin, Yunlin (TW); Jung Yen Huang, Taoyuan (TW); Shinya Ono, Santa Clara, CA (US); Ting-Kuo Chang, San Jose, CA (US); Shih Chang Chang, Cupertino, CA (US); Chih-Hung Yu, Taoyuan (TW); Chia-Yu Chen, Zhubei (TW); Yung Fong Kao, Taoyuan (TW); Shih Lun Huang, Taoyuan (TW); Xingfeng He, Santa Clara, CA (US); Chieh-Wei Chen, Taichung (TW); Lei Yuan, San Jose, CA (US); Gwanwoo Park, Yongin (KR)

(73) Assignee: Apple Inc., Cupertino, CA (US)

( * ) Notice: Subject to any disclaimer, the term of this patent is extended or adjusted under 35 U.S.C. 154(b) by 715 days.

(21) Appl. No.: 17/395,379

(22) Filed: Aug. 5, 2021

Related U.S. Application Data

(60) Provisional application No. 63/067,262, filed on Aug. 18, 2020, provisional application No. 63/067,261, filed on Aug. 18, 2020.

(51) Int. Cl.
*H10K 59/122* (2023.01)
*H10K 59/131* (2023.01)
*H10K 59/35* (2023.01)

(52) U.S. Cl.
CPC ....... *H10K 59/1315* (2023.02); *H10K 59/122* (2023.02); *H10K 59/352* (2023.02); *H10K 59/353* (2023.02)

(58) Field of Classification Search
CPC ......... G09G 2320/0214; H10K 59/122; H10K 59/1315
See application file for complete search history.

(56) References Cited

U.S. PATENT DOCUMENTS

| | | |
|---|---|---|
| 7,239,309 B2 | 7/2007 | Smith et al. |
| 7,864,136 B2 | 1/2011 | Matthies et al. |
| (Continued) | | |

FOREIGN PATENT DOCUMENTS

KR 20160072010 A 6/2016

*Primary Examiner* — Eric K Ashbahian
(74) *Attorney, Agent, or Firm* — Treyz Law Group, P.C.; Joseph F. Guihan; Jinie M. Guihan

(57) ABSTRACT

An organic light-emitting diode (OLED) display may have an array of organic light-emitting diode pixels that each have OLED layers interposed between a cathode and an anode. Voltage may be applied to the anode of each pixel to control the magnitude of emitted light. The conductivity of the OLED layers may allow leakage current to pass between neighboring anodes in the display. To reduce leakage current and the accompanying cross-talk, the display may include active and/or passive leakage-mitigating structures. The passive leakage-mitigating structures may have an undercut that causes discontinuities in the overlying OLED layers. Active leakage-mitigating structures may include a conductive layer (e.g., a conductive ring) that drains leakage current to ground. Alternatively, the active leakage-mitigating struc- (Continued)

tures may include a gate electrode modulator with a variable voltage that stops the current flow laterally.

19 Claims, 42 Drawing Sheets

(56) References Cited

U.S. PATENT DOCUMENTS

| | | |
|---|---|---|
| 8,217,571 B2 | 7/2012 | Lee et al. |
| 8,628,986 B2 | 1/2014 | Amamiya et al. |
| 9,224,972 B2 | 12/2015 | Shin |
| 9,444,050 B2 | 9/2016 | Madigan |
| 9,614,191 B2 | 4/2017 | Madigan |
| 9,735,212 B2 * | 8/2017 | Pang .................. H10K 59/123 |
| 9,978,818 B2 | 5/2018 | Xiong et al. |
| 10,304,906 B2 | 5/2019 | Hack et al. |
| 10,468,637 B2 | 11/2019 | Defranco et al. |
| 10,522,601 B2 | 12/2019 | Madigan |
| 2004/0119419 A1 | 6/2004 | Kai et al. |
| 2006/0061266 A1 | 3/2006 | Kang et al. |
| 2010/0033089 A1 | 2/2010 | Nakamura et al. |
| 2010/0181559 A1 | 7/2010 | Nakatani et al. |
| 2012/0007067 A1 | 1/2012 | Kaneta et al. |
| 2014/0091285 A1 | 4/2014 | Shin et al. |
| 2014/0103385 A1 * | 4/2014 | Hatano .................. H10K 50/19 438/28 |
| 2015/0048328 A1 | 2/2015 | Kato et al. |
| 2015/0357388 A1 * | 12/2015 | Pang ..................... H10K 59/88 438/23 |
| 2015/0379938 A1 * | 12/2015 | Choi ..................... G09G 3/3291 345/82 |
| 2016/0248035 A1 | 8/2016 | Hwang et al. |
| 2016/0266295 A1 | 9/2016 | Cho et al. |
| 2016/0268354 A1 | 9/2016 | Xiong et al. |
| 2017/0236853 A1 * | 8/2017 | Sagawa .................. H10K 71/00 257/40 |
| 2017/0317104 A1 | 11/2017 | Jeong et al. |
| 2017/0373124 A1 * | 12/2017 | Yang .................. H10K 59/879 |
| 2019/0058022 A1 | 2/2019 | Baik et al. |
| 2019/0288156 A1 * | 9/2019 | Chaji .................. H01L 29/42312 |
| 2020/0044177 A1 * | 2/2020 | Kim ...................... H10K 59/30 |
| 2020/0066815 A1 | 2/2020 | Choi et al. |
| 2020/0312930 A1 | 10/2020 | Choi et al. |
| 2021/0201805 A1 | 7/2021 | Feng et al. |
| 2022/0020827 A1 * | 1/2022 | Liu .................. H10K 59/80515 |
| 2022/0115483 A1 * | 4/2022 | Li ...................... H01L 27/1255 |
| 2022/0320851 A1 * | 10/2022 | Cai ...................... H10K 59/131 |

\* cited by examiner

ORGANIC LIGHT-EMITTING DIODE DISPLAY WITH PASSIVE LEAKAGE-REDUCING STRUCTURES

This application claims the benefit of provisional patent application No. 63/067,261, filed Aug. 18, 2020, and provisional patent application No. 63/067,262, filed Aug. 18, 2020, which are hereby incorporated by reference herein in their entireties.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

To emit light from a given pixel in an organic light-emitting diode display, a voltage may be applied to the anode of the given pixel. Ideally, the voltage at the anode of the given pixel would not affect any neighboring pixels. However, the conductivity of the OLED layers between the anodes may allow lateral conduction from the anode of the given pixel to the anodes of adjacent pixels. This may cause pixel cross-talk that allows nominally 'off' pixels to emit light due to an adjacent 'on' pixel's leakage. The pixel cross-talk may degrade display performance and cause a color-shift in the resulting image.

It may be desirable to reduce the distance between pixels in a display in order to increase the resolution of the display. However, pixel cross-talk due to lateral conduction through OLED layers may worsen as the distance between pixels decreases.

It would therefore be desirable to be able to provide improved displays for electronic devices.

SUMMARY

An electronic device may have a display such as an organic light-emitting diode display. The organic light-emitting diode (OLED) display may have an array of organic light-emitting diode pixels that each have OLED layers interposed between a cathode and an anode.

Each organic light-emitting diode pixel may have a respective anode. Voltage may be applied to the anode of each organic light-emitting diode pixel to control how much light is emitted from each organic light-emitting diode pixel. OLED layers formed above the anode (e.g., a hole injection layer, a hole transport layer, an emissive layer, an electron transport layer, an electronic injection layer, an electron blocking layer, a charge generation layer, and/or a hole blocking layer) may be conductive. These conductive layers may be referred to as laterally conductive layers. The conductivity of the OLED layers may allow leakage current to pass between neighboring anodes in the display.

To reduce leakage current and the accompanying cross-talk in a display, the display include active and/or passive leakage-mitigating structures. The passive leakage-mitigating structures may be formed in rings around the pixels. A passive leakage-mitigating structure may be formed on the anode of a pixel between the anode and the pixel definition layer. A passive leakage-mitigating structure may be formed on an upper surface of the pixel definition layer. A passive leakage-mitigating structure may be formed on a substrate partially in a trench of the pixel definition layer. The passive leakage-mitigating structure may have an undercut that causes discontinuities in the overlying OLED layers, thus mitigating lateral leakage.

Active leakage-mitigating structures may include a conductive layer (e.g., a conductive ring) that drains leakage current to ground. Alternatively, the active leakage-mitigating structures may include a gate electrode modulator with a variable voltage that stops the current flow laterally. The active leakage-mitigating structure may be formed in a trench in the pixel definition layer or on the upper surface of the pixel definition layer.

DETAILED DESCRIPTION

Figure 1:
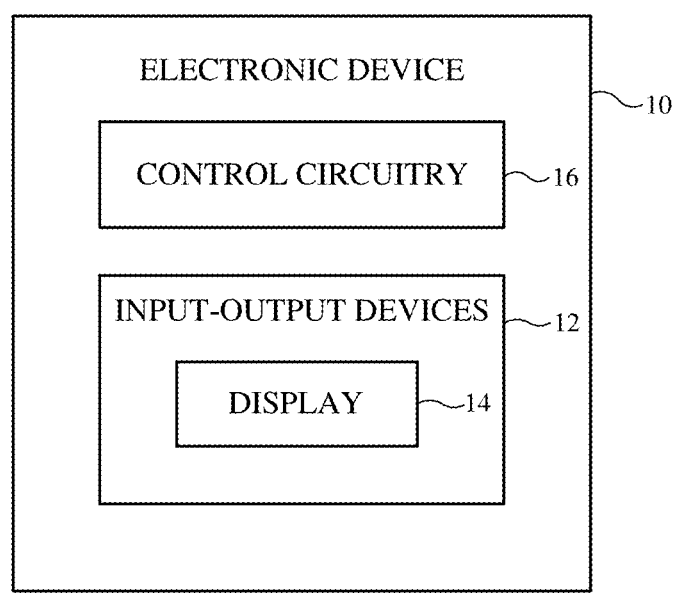
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user. As examples, electronic device 10 may be an augmented reality (AR) headset and/or virtual reality (VR) headset.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
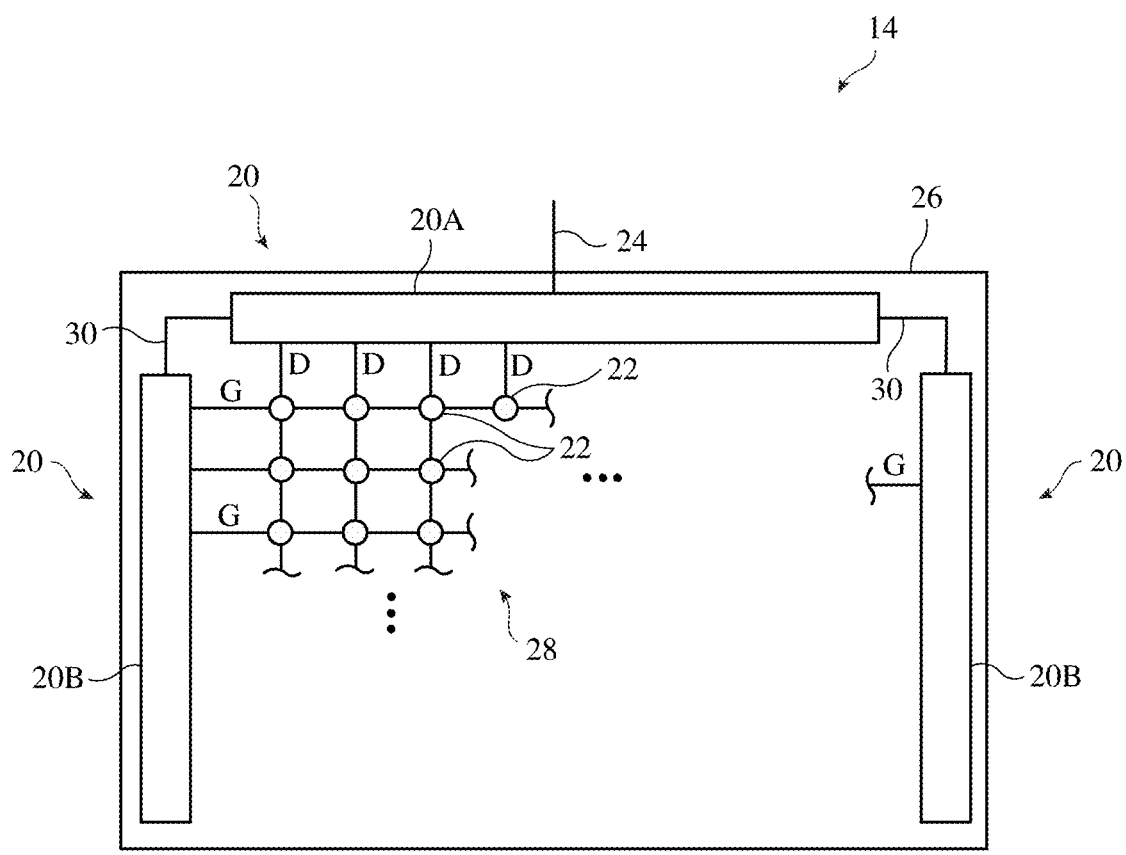
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
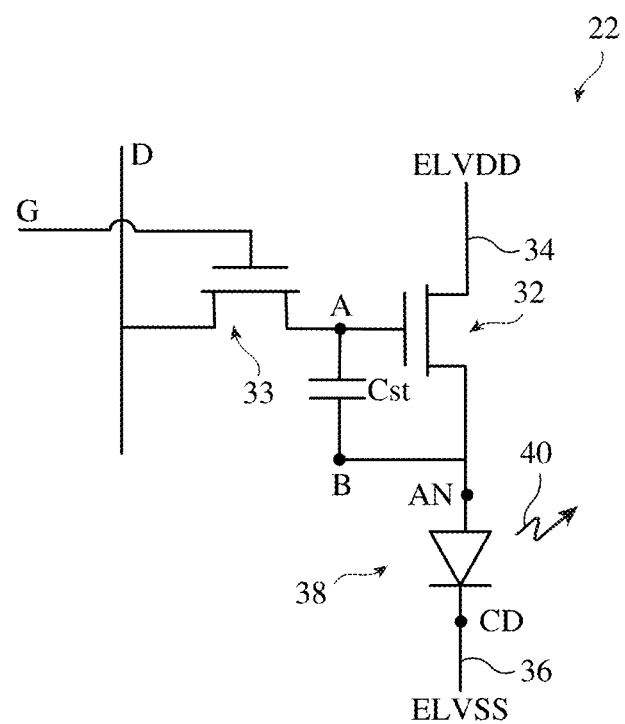
FIG. 3 is a diagram of an illustrative pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a negative (ground) power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
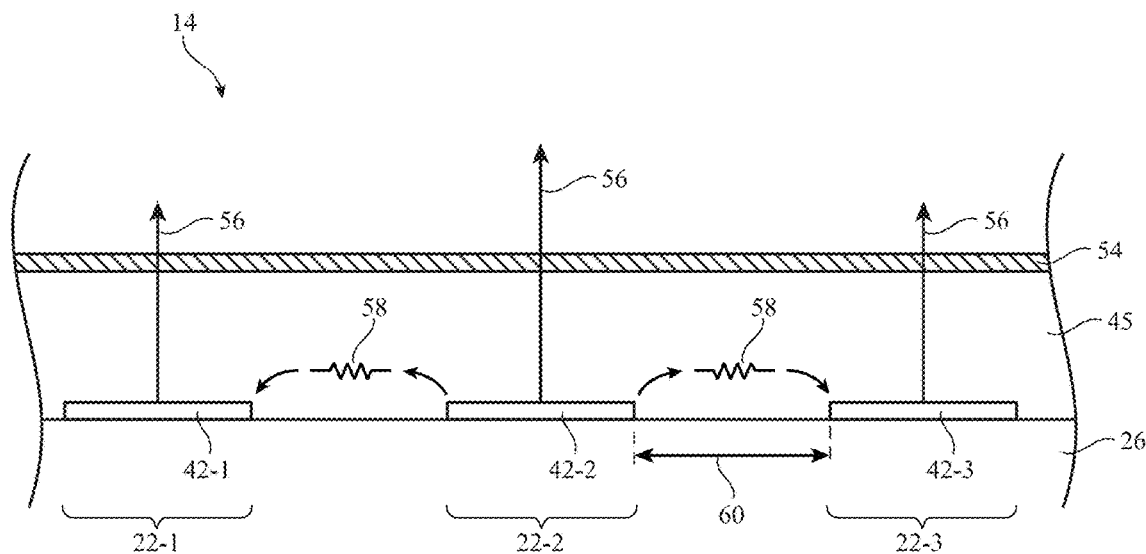
FIG. 4 is a cross-sectional side view of an illustrative organic light-emitting diode display showing lateral current leakage between adjacent anodes in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Anodes such as anodes 42-1, 42-2, and 42-3 may be formed on the substrate. Anodes 42-1, 42-2, and 42-3 may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an emissive layer (EML), an electron-transport layer (ETL), and an electronic-injection layer (EIL). Cathode 54 may be a conductive layer formed on the OLED layers 45. Cathode layer 54 may form a common cathode terminal (see, e.g., cathode terminal CD of FIG. 3) for all diodes in display 14. Cathode layer 54 may be formed from a transparent conductive material (e.g., indium tin oxide, a metal layer(s) that is sufficiently thin to be transparent, a combination of a thin metal and indium tin oxide, etc.). Each anode in display 14 may be independently controlled, so that each diode in display 14 can be independently controlled. This allows each pixel 22 to produce an independently controlled amount of light.

Anodes 42-1, 42-2, and 42-3 may each be associated with a respective pixel. For example, anode 42-1 may be associated with pixel 22-1, anode 42-2 may be associated with pixel 22-2, and anode 42-3 may be associated with pixel 22-3. To emit light from a pixel, a voltage may be applied to the anode of the respective pixel. Take an example in which it is desired to emit light from pixel 22-2 (without emitting light from pixels 22-1 and 22-3). A voltage may be applied to anode 42-2, which causes light 56 to be emitted from pixel 22-2. As previously stated, it would be desirable if no light was emitted from pixels 22-1 and 22-3 as a result of voltage being applied to anode 42-2. However, as shown, leakage may occur through OLED layers 45 between anode 42-2 and anode 42-1, as well as between anode 42-2 and anode 42-3. There may be a resistance 58 (i.e., a resistance associated with the OLED layers) between anode 42-2 and the adjacent anodes that helps prevent leakage. The greater the resistance, the less leakage current will reach anodes 42-1 and 42-3. However, the resistance may not be large enough to totally eliminate leakage between anode 42-2 and anodes 42-1 and 42-3. As shown, even though pixels 22-1 and 22-3 are intended to be off, light 56 may be emitted from pixels 22-1 and 22-3. The resistance 58 between adjacent anodes may be reduced as the distance 60 between adjacent anodes is reduced. In order to maximize display resolution, it is desirable for the distance 60 between adjacent anodes to be small. However, this reduces the resistance 58 between anodes and increases cross-talk between pixels.

Although not shown in FIG. 4, display 14 may optionally include a pixel definition layer (PDL). The pixel definition layer may be formed from a dielectric material and may be interposed between adjacent anodes of the display. The pixel definition layer may have openings in which the anodes are formed, thereby defining the area of each pixel. Each of the following embodiments of an organic light-emitting diode display may optionally include a pixel definition layer.

Figure 5A:
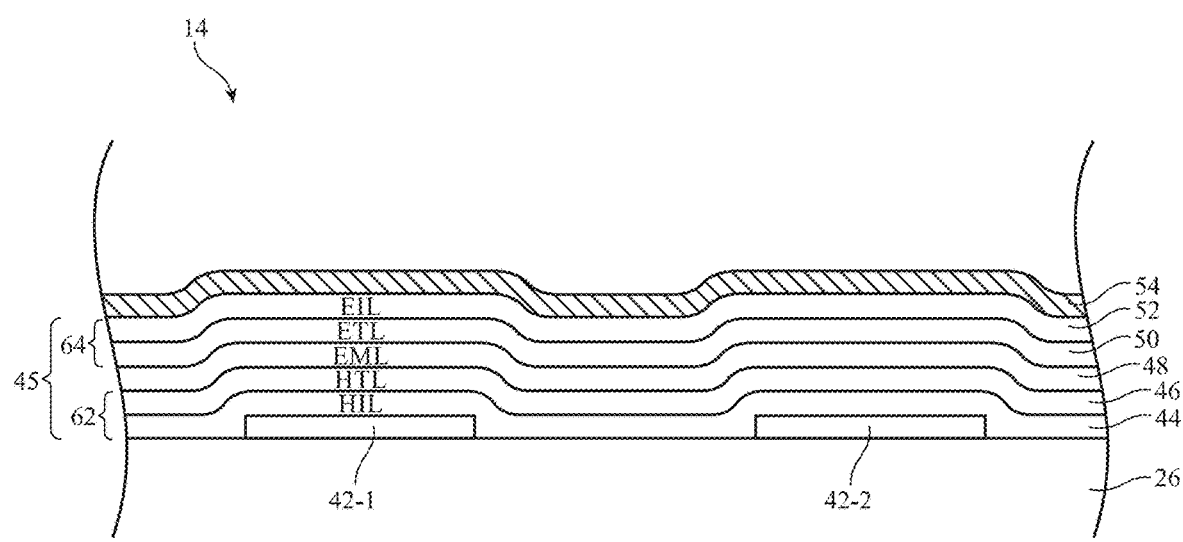
FIG. 5A is a cross-sectional side view of an illustrative organic light-emitting diode display showing different layers of the organic light-emitting diodes in accordance with an embodiment.

FIG. 5A is a cross-sectional side view of an illustrative display with organic light-emitting diode display pixels. FIG. 5A shows details of the OLED layers 45 from FIG. 4. As shown, OLED layers 45 (sometimes referred to as an organic stack-up, an organic stack, or an organic light-emitting diode (OLED) stack) may include a hole injection layer (HIL) 44, a hole transport layer (HTL) 46, an emissive layer (EML) 48, an electron transport layer (ETL) 50, and an electron injection layer (EIL) 52 interposed between anodes 42 and cathode 54. The hole injection layer and hole transport layer may collectively be referred to as a hole layer (i.e., hole layer 62). The electron transport layer and the electron injection layer may collectively be referred to as an electron layer (i.e., electron layer 64). Emissive layer 48 may include organic electroluminescent material. As shown, hole layer 62 and electron layer 64 may be blanket (common) layers that cover the entire array.

Ideally, adjacent diodes in display 14 operate independently. In practice, the presence of common layers such as hole layer 62 present an opportunity for leakage current from one diode to flow laterally into an adjacent diode, thereby potentially biasing the adjacent diode. For example, there is a possibility that the process of applying a drive current between anode 42-1 and cathode 54 will give rise to lateral leakage current through hole layer 62 (e.g., a current from anode 42-1 to anode 42-2). In order to reduce leakage between anodes through hole layer 62, it may be desirable to increase the resistance of the hole layer between adjacent anodes.

The examples of layers included between the anodes 42 and the cathode 54 in FIG. 5A are merely illustrative. If desired, additional layers may be included between anodes 42 and cathode 54 (i.e., an electron blocking layer, a charge generation layer, a hole blocking layer, etc.), such as in a tandem organic light-emitting diode.

Figure 5B:
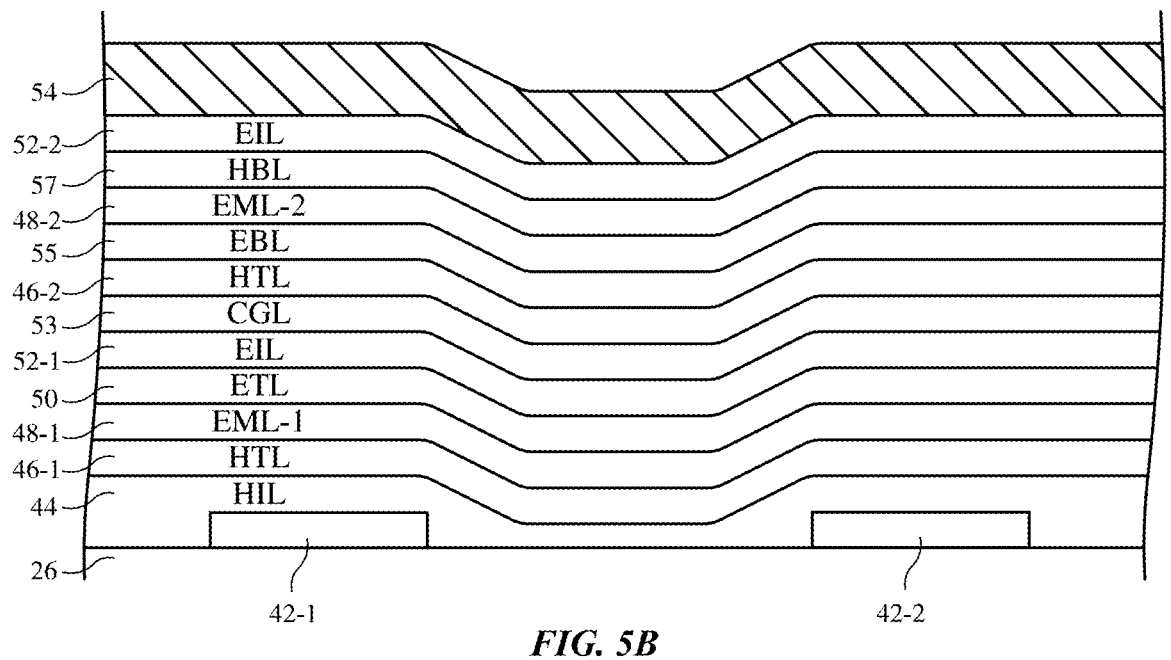
FIG. 5B is a cross-sectional side view of an illustrative organic light-emitting diode display showing different layers of a tandem organic light-emitting diode in accordance with an embodiment.

FIG. 5B is a cross-sectional side view of a tandem organic light-emitting diode (OLED), with at least two stacked OLED units. As shown in FIG. 5B, the tandem OLED may include a hole injection layer (HIL) 44, a first hole transport layer (HTL) 46-1, a first emissive layer (EML-1) 48, an electron transport layer (ETL) 50, a first electron injection layer (EIL) 52-1, a charge generation layer (CGL) 53, a second hole transport layer (HTL) 46-2, an electron blocking layer (EBL) 55, a second emissive layer (EML-2) 48-2, a hole blocking layer (HBL) 57, and a second electron injection layer (EIL) 52-2 interposed between anodes 42 and cathode 54. This arrangement of layers for a tandem diode is merely illustrative. Other tandem diode stackups may be used if desired.

In general, any desired layers may be included in between the anodes and the cathode and any layer that is formed across the display may be considered a common laterally conductive layer. Each layer in light-emitting diode (LED) layers 45 may be formed from any desired material. In some embodiments, the layers may be formed from organic material (optionally including organic or inorganic dopants). However, in some cases one or more layers may be formed from inorganic material. Any or all of the LED layers 45 may be blanket (common) layers that cover the entire array. The display may also include quantum dots (e.g., quantum dot layers) if desired. For example, a display may include OLEDs to produce blue light and quantum dot layers to convert the blue light to red and green light.

In the example of FIGS. 5A and 5B, a patterned anode layer is formed below a common cathode layer. This example is merely illustrative. If desired, the organic light-emitting diode may be inverted such that the cathode is patterned per-pixel and the anode is a common layer. In this case, the order of the OLED layers in organic stack 45 may be inverted as well. For example, the electron injection layer may be formed on a patterned cathode, the electron transport layer may be formed on the electron injection layer, the emissive layer may be formed on the electron transport layer, the hole transport layer may be formed on the emissive layer, the hole injection layer may be formed on the hole transport layer, and a common anode layer may be formed on the hole injection layer.

In subsequent embodiments, a patterned anode is depicted as being positioned below a common cathode layer. However, it should be understood that in each of these embodiments the anode and cathode may be inverted as previously described.

In some cases, a laterally conductive layer may be patterned or otherwise formed with gaps to reduce lateral leakage between pixels. In other words, the laterally conductive layer may be physically interrupted by an air gap or other barrier that prevents lateral leakage from occurring.

As one example, a leakage-mitigating structure may be formed directly on the anode of a given pixel. The leakage-mitigating structure may cause a discontinuity in one or more laterally conductive layers that is formed on the leakage-mitigating structure, thus mitigating leakage through the laterally conductive layers. The leakage-mitigating structure may partially or totally enclose the anode (e.g., form a ring around the anode). Because, the leakage-mitigating structure causes a discontinuity (or cut) in a lateral conductive layer, the leakage-mitigating structure may sometimes be referred to as a cutting ring, OLED layer cutting ring, cutting structure, OLED layer cutting structure, laterally conductive layer cutting ring, or laterally conductive layer cutting structure.

It may be desirable to create discontinuities in one or more of the organic light-emitting diode layers in the display (to prevent lateral leakage through the organic light-emitting diode layers). However, it may also be desirable to maintain continuity in one or more other layers in the display (e.g., cathode 54). Therefore, the shape of the leakage-mitigating structure may be designed such that one or more organic light-emitting diode layers deposited over the leakage-mitigating structure has discontinuities while additional organic light-emitting diode layers and/or cathode 54 deposited over the leakage-mitigating structure do not have discontinuities.

Figure 6:
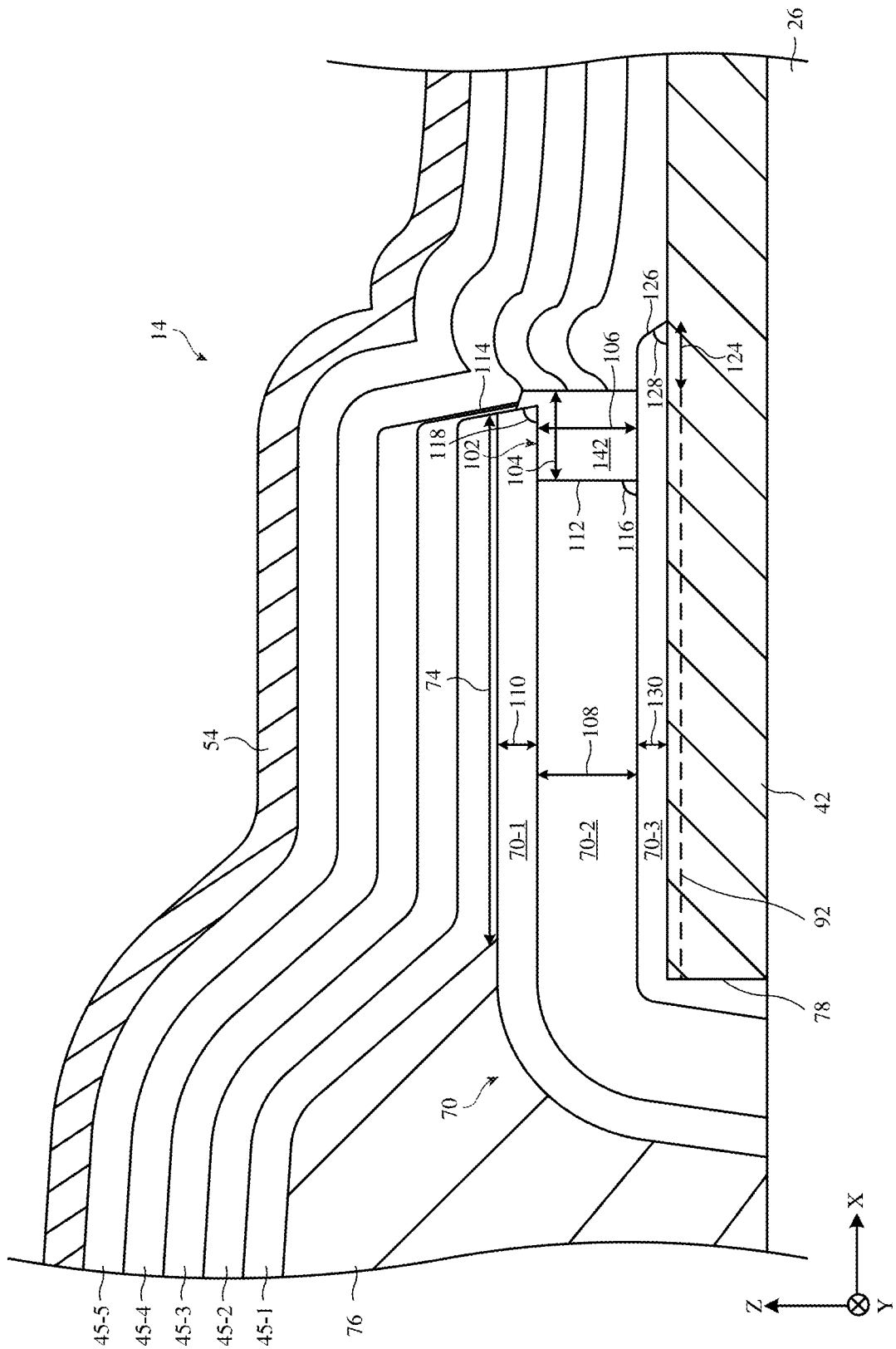
FIG. 6 is a cross-sectional side view of an illustrative organic light-emitting diode display having a leakage-mitigating structure that is interposed between an anode and a pixel definition layer in accordance with an embodiment.

FIG. 6 is a cross-sectional side view of a display having a leakage-mitigating structure formed directly on anode 42. As shown, leakage-mitigating structure 70 is formed over anode 42 and has an undercut 102. Undercut 102 may sometimes also be referred to as recess 102, cavity 102, hole, 102, indentation 102, etc. The undercut is a void in the leakage-mitigating structure material that is still covered by a portion of the leakage-mitigating structure. As shown in FIG. 6, undercut 102 may have a width 104 and a height 106. In this arrangement, width 104 is defined as the distance between the edge of portion 70-1 of the leakage-mitigating structure and the edge of portion 70-2 of the leakage-mitigating structure. Height 106 is defined as the distance between a lower surface of portion 70-1 of the leakage-mitigating structure and an upper surface of portion 70-3 of the leakage-mitigating structure. Width 104 and height 106 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). Height 106 and width 104 may the same or may be different. In one example, height 106 may be less than 50 nanometers and width 104 may be greater than 20 nanometers.

In the example of FIG. 6, leakage-mitigating structure 70 may be formed from portions 70-1, 70-2, and 70-3 (sometimes referred to as layers 70-1, 70-2, and 70-3) that are formed during individual deposition steps. In other words, portions 70-1, 70-2, and 70-3 may be deposited separately when the leakage-mitigating structure is formed. Each portion may be formed from any desired material (e.g., silicon nitride, silicon dioxide, an organic material, etc.). In one example, portions 70-1 and 70-3 may be formed from silicon dioxide ($SiO_2$) and portion 70-2 may be formed from silicon nitride (SiN). The materials may be selected to tune the size of the undercut formed during etching. In general, any combination of materials may be used.

Portion 70-1 may have a thickness 110, portion 70-2 may have a thickness 108, and portion 70-3 may have a thickness 130. Thicknesses 108, 110, and 130 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). Thicknesses 108, 110, and 130 may be the same or may be different.

The angles of the edges of portions 70-1, 70-2, and 70-3 may be selected to control the discontinuities of the overlying organic light-emitting diode layers. As shown in FIG. 6, portion 70-3 has an edge surface 126 that is at an angle 128 relative to the planar upper surface of anode 42 (and relative to the planar lower surface of portion 70-3). Portion 70-2 has an edge surface 112 that is at an angle 116 relative to the planar upper surface of anode 42 (and relative to the planar lower surface of portion 70-2). Portion 70-1 has an edge surface 114 that is at an angle 118 relative to the planar upper surface of anode 42 (and relative to the planar lower surface of portion 70-1). Angles 116, 118, and 128 may be the same or may be different. Each of the angles may be any desired angle (e.g., between 45° and 90°, between 25° and 135°, between 45° and 55°, between 55° and 65°, between 75° and 85°, between 85° and 950 between 450 and 65°, between 70° and 90°, between 10° and 45°, less than 90°, etc.).

In FIG. 6, a portion of layer 70-3 is not covered by layer 70-1. Said another way, layer 70-3 extends past the edge of layer 70-1 (e.g., towards the center of the anode). The width 124 of the portion of layer 70-3 that is not covered by layer 70-1 may be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, less than 10 nanometers, more than 10 nanometers, more than 20 nanometers, between 10 and 100 nanometers, etc.). The portion of layer 70-3 that is not covered by layer 70-1 may be referred to as a step portion or footer of the leakage-mitigating structure. Width 124 may be greater than 40 nanometers.

FIG. 6 shows how discontinuities may be formed in the organic light-emitting diodes deposited over the leakage-mitigating structure. As shown in FIG. 6, organic light-emitting diode layers 45-1, 45-2, 45-3, 45-4, and 45-5 are formed over the leakage-mitigating structure 70 and anode 42. Cathode layer 54 is formed over the organic light-emitting diode layers.

The presence of undercut 102 may result in a void 142 present between the leakage-mitigating structure and organic light-emitting diode layers. In the example of FIG. 6, void 142 (sometimes referred to as air-filled void 142, air-filled region 142, insulator-filled void 142, etc.) forms discontinuities between respective portions of organic light-emitting diode layer 45-1. The void may be filled with air or any other desired material. The void also forms discontinuities between respective portions of organic light-emitting diode layer 45-2. Finally, the void forms discontinuities between respective portions of organic light-emitting diode layer 45-3. In this way, lateral leakage through organic light-emitting diode layers 45-1, 45-2, and 45-3 may be prevented. While forming discontinuities in organic light-emitting diode layers 45-1, 45-2, and 45-3, the void may not form discontinuities between organic light-emitting diode layer 45-4, organic light-emitting diode layer 45-5, and cathode layer 54.

The shape of leakage-mitigating structure 70 may determine how many of the organic light-emitting diode layers are interrupted by void 142. In FIG. 6, three organic light-emitting diode layers (45-1, 45-2, and 45-3) are interrupted by void 142 whereas two organic light-emitting diode layers (45-4 and 45-5) are not interrupted by void 142. As previously mentioned, in one illustrative arrangement, organic light-emitting diode layer 45-1 may be a hole injection layer, organic light-emitting diode layer 45-2 may be a hole transport layer, organic light-emitting diode layer 45-3 may be an emissive layer, organic light-emitting diode layer 45-4 may be an electron transport layer, and organic light-emitting diode layer 45-5 may be an electron injection layer. In another illustrative arrangement (e.g., when a tandem diode arrangement is used), organic light-emitting diode layer 45-1 may be a hole layer, organic light-emitting diode layer 45-2 may be a first emissive layer, organic light-emitting diode layer 45-3 may be a charge generation layer, organic light-emitting diode layer 45-4 may be a second emissive layer, and organic light-emitting diode layer 45-5 may be an electron layer.

Organic light-emitting diode layer 45-3 (e.g., the last layer interrupted by the void) may have a higher conductivity than organic light-emitting diode layer 45-4 (e.g., the first layer that is not interrupted by the void). In other words, the discontinuities in the organic light-emitting diode layers may be propagated to ensure discontinuity of a high conductivity organic light-emitting diode layer. This may effectively reduce lateral leakage between pixels in the display. Continuity in the remaining organic light-emitting diode layers (e.g., 45-4 and 45-5) may be maintained while still ensuring satisfactory light leakage levels.

In general, each of the organic light-emitting diode layers may have any desired conductivity, and discontinuities may be propagated through the organic light-emitting diode layers by leakage-mitigating structure until lateral light leakage is reduced to satisfactory levels (while maintaining continuity of the cathode layer). In other words, in an example where organic light-emitting diode layer 45-3 has a low conductivity and organic light-emitting diode layer 45-2 has a high conductivity (e.g., higher than layer 45-3), the discontinuities may only be present in organic light-emitting diode layers 45-1 and 45-2 (while organic light-emitting diode layers 45-3, 45-4, and 45-5 remain continuous). In yet another example where organic light-emitting diode layer 45-2 has a low conductivity and organic light-emitting diode layer 45-1 has a high conductivity (e.g., higher than layer 45-2), the discontinuities may only be present in organic light-emitting diode layer 45-1 (while organic light-emitting diode layers 45-2, 45-3, 45-4, and 45-5 remain continuous).

The example of having five OLED layers between cathode 54 and anode 42 is merely illustrative. Additional OLED layers may be incorporated if desired. For example, in FIG. 5B there are 11 OLED layers used to form a tandem diode. In this type of arrangement, leakage-mitigating structure 70 may cause discontinuities in one or more of the OLED layers. In one example, HIL, HTL, EML-1, ETL, EIL, CGL, HTL, EBL, and EML-2 may all have discontinuities caused by leakage-mitigating structure whereas HBL and EIL may not have a discontinuity. In general, discontinuities may be propagated through any desired number of the OLED layers in the tandem diode while maintaining continuity in cathode 54.

As shown in FIG. 6, leakage-mitigating structure 70 is formed from a different material than pixel definition layer 76. Pixel definition layer 76 may be formed from an organic material (that is a different material than any of the materials within leakage-mitigating structure 70). In contrast, leakage-mitigating structure 70 may be formed from one or more inorganic materials. Pixel definition layer 76 may be formed over a portion of leakage-mitigating structure 70. However, the pixel definition layer may be offset from the edge of the leakage-mitigating structure by a distance 74. This separation between the pixel definition layer and the edge of the leakage-mitigating structure may ensure that the OLED layers 45 are planar (and therefore consistent) at the edge of the leakage-mitigating structure that causes the leakage-mitigating discontinuities in some of the OLED layers. Distance 74 may be greater than 200 nanometers, greater than 300 nanometers, greater than 500 nanometers, greater than 800 nanometers, greater than 1,000 nanometers, less than 5 microns, less than 3 microns, less than 2 microns, less than 1 micron, between 500 nanometers and 5 microns, etc.

Leakage-mitigating structure 70 is in direct contact with pixel definition layer 76 (e.g., along an upper surface of portion 70-1) and is in direct contact with anode 42 (e.g., along a lower surface of portion 70-3). The upper surface of portion 70-1 is also in direct contact with OLED layer 45-1. Said another way, leakage-mitigating structure 70 has first and second opposing surfaces, with the first surface adjacent to (and in direct contact with) pixel definition layer 76 and OLED layer 45-1 and the second surface adjacent to (and in direct contact with) anode 42.

Leakage-mitigating structure 70 may conform to an edge surface 78 of anode 42. Covering edge surface 78 of anode 42 with a portion of leakage-mitigating structure 70 may protect the anode sidewall 78 from damage. Anode 42 (which may be formed from silver or indium tin oxide) may be susceptible to oxidation. Having portion 70-3 of leakage-mitigating structure 70 conform to and directly contact sidewall 78 of anode 42 may protect the anode from undesired oxidation during display manufacturing (e.g., caused by subsequent vapor deposition steps).

Any of the dimensions of the leakage-mitigating structure may be tuned to impart the desired discontinuities on the organic light-emitting diode layers. For example, thicknesses 108, 110, and 130 of each leakage-mitigating structure portion, the width 104 and height 106 of undercut 102, angles 116, 118, 128, step portion width 124, PDL separation distance 74, etc. may all be selected such that desired discontinuities are formed when the organic light-emitting diode layers are deposited. In one illustrative example, width 130 may be between 5 nanometers and 15 nanometers, width 108 (and therefore undercut height 106) may be between 30 nanometers and 50 nanometers, and width 110 may be between 15 nanometers and 25 nanometers. The total thickness of leakage-mitigating structure 70 may be less than 80 nanometers. Width 104 may be greater than 50 nanometers (e.g., between 50 and 150 nanometers). Angles 118 and 128 may each be some angle between (or including) 50 degrees and 80 degrees. In one example, angles 118 and 128 are the same. Distance 74 may be greater than 500 nanometers. The pixel definition layer portions and organic light-emitting diode layers may be formed using vapor deposition techniques, photolithography techniques, etc. To modify the dimensions of the pixel definition layer portions, exposure levels, mask profile, deposition pressure, gas composition, and/or other desired manufacturing properties may be tuned.

In FIG. 6, leakage-mitigating structure 70 is formed directly on anode 42 and underneath pixel definition layer 76. This example is merely illustrative. In another possible embodiment, shown in FIG. 7, leakage-mitigating structure 70 may be formed on an upper surface of pixel definition layer 76. Leakage-mitigating structure 70 in FIG. 7 may have the same dimensions and structure as in FIG. 6 (and these dimensions will therefore not be repeated here).

Although only one undercut in the leakage-mitigating structure is necessary to cause discontinuities in the OLED layers and mitigate lateral leakage, the leakage-mitigating structure may have first and second undercuts 102-1 and 102-2 on first and second opposing sides of the leakage-mitigating structure 70. Having the leakage-mitigating structure be symmetrical in this way may make the manufacturing of the leakage-mitigating structure 70 less complex and costly.

Each undercut may cause discontinuities in one or more layers within OLED layers 45 (as shown in detail in connection with FIG. 6). For example, undercut 102-1 may cause first discontinuities in one or more OLED layers 45. Undercut 102-2 may cause second discontinuities in one or more OLED layers 45. Because undercuts 102-1 and 102-2 are symmetrical, each undercut may cause discontinuity in the same number of OLED layers. Cathode 54 remains continuous over leakage-mitigating structure 70.

Figure 7:
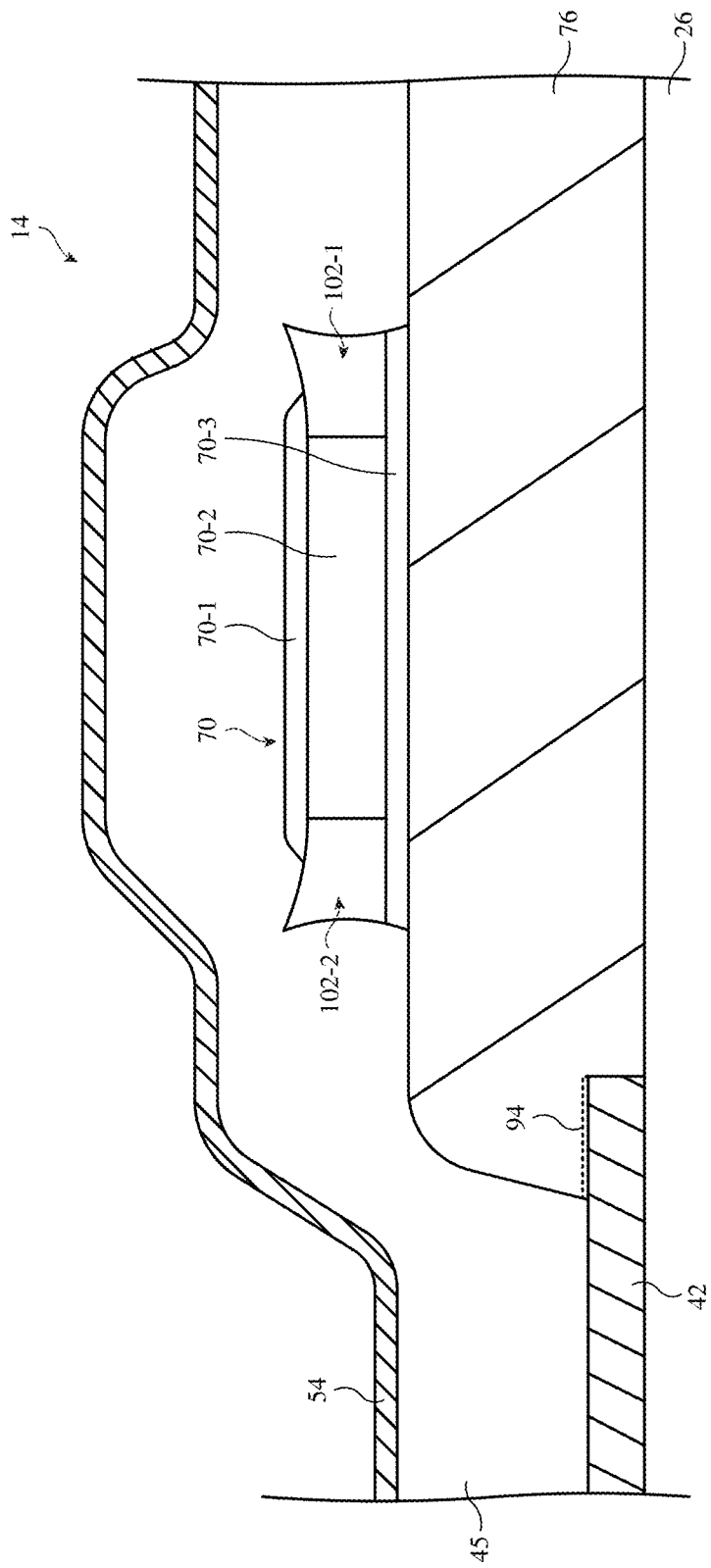
FIG. 7 is a cross-sectional side view of an illustrative organic light-emitting diode display having a leakage-mitigating structure that is formed on an upper surface of a pixel definition layer in accordance with an embodiment.
Figure 8:
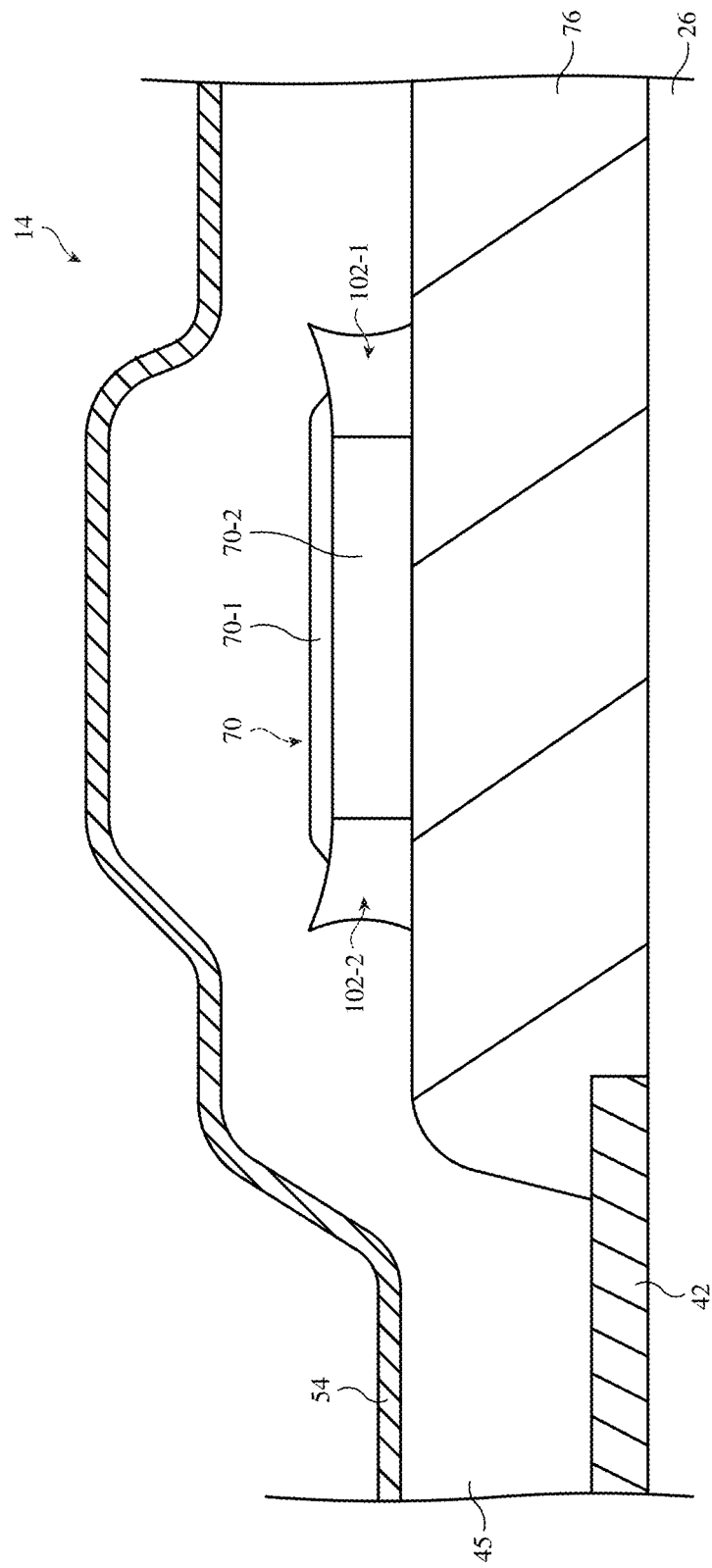
FIG. 8 is a cross-sectional side view of an illustrative organic light-emitting diode display having a leakage-mitigating structure that is formed on an upper surface of a pixel definition layer and that includes only two layers in accordance with an embodiment.

In FIGS. 6 and 7, leakage-mitigating structure 70 is formed from three different portions. In one example, portions 70-1 and 70-3 may be formed from silicon dioxide ($SiO_2$) and portion 70-2 may be formed from silicon nitride (SiN). However, it should be noted that portion 70-3 may optionally be omitted if desired. FIG. 8 shows an example where leakage-mitigating structure 70 includes only portions 70-1 and 70-2. Portions 70-1 and 70-2 may be formed from the same material or from different materials. For example, portion 70-1 may be formed from silicon dioxide and portion 70-2 may be formed from silicon nitride. In this case, portion 70-2 is formed in direct contact with the upper surface of pixel definition layer 76. Portion 70-3 may be omitted from the leakage-mitigating structure 70 in FIG. 6, 7, or 9 if desired.

Figure 9:
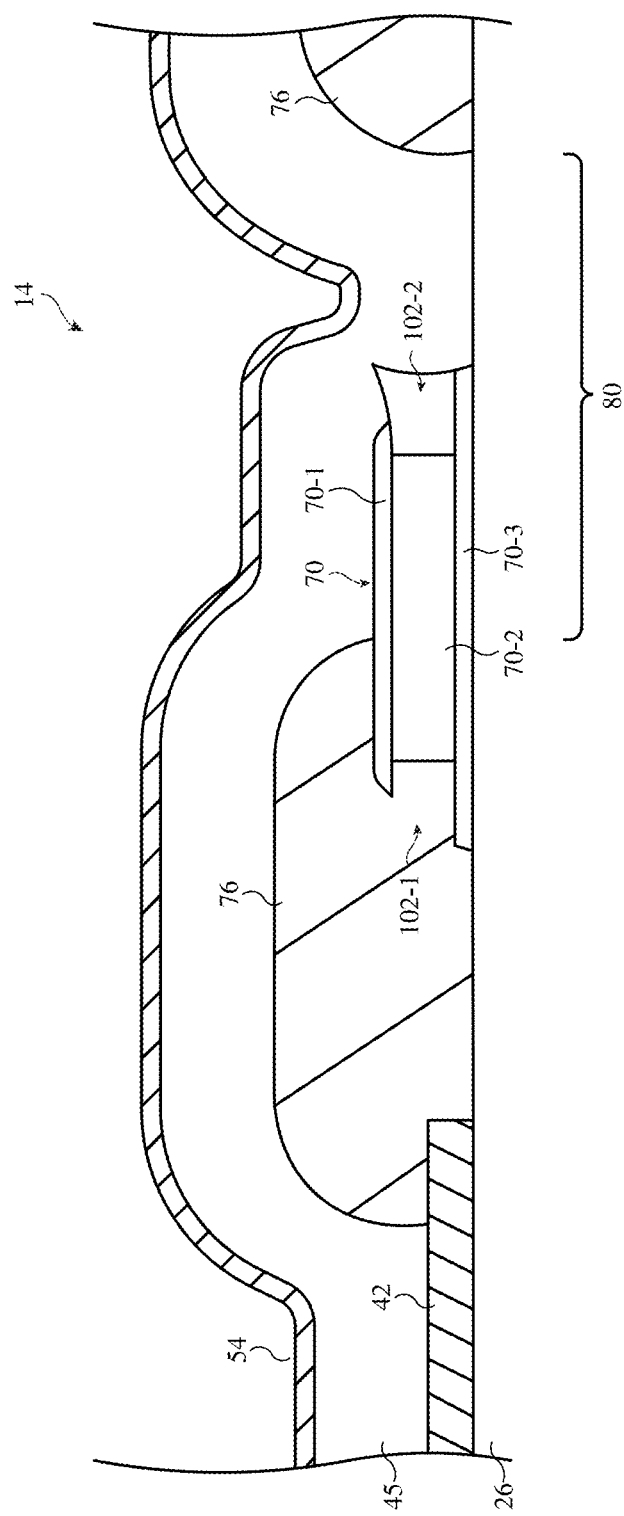
FIG. 9 is a cross-sectional side view of an illustrative organic light-emitting diode display having a leakage-mitigating structure that is formed on a substrate and that has a portion overlapped by a trench in a pixel definition layer in accordance with an embodiment.

FIG. 9 is a cross-sectional side view showing another possible arrangement for leakage-mitigating structure 70. As shown in FIG. 9, there may be a trench 80 within pixel definition layer 76 and leakage-mitigating structure 70 may be partially formed within the trench. Leakage-mitigating structure 70 is symmetric and therefore has first and second undercuts 102-1 and 102-2 (similar to as in FIGS. 7 and 8). Leakage-mitigating structure 70 is formed on substrate 26 (e.g., not directly on anode 42). The first undercut 102-1 is filled by pixel definition layer 76 (e.g., the organic material of pixel definition layer 76 conforms to and fills the void left by undercut 102-1). Undercut 102-1 therefore does not cause discontinuities in OELD layers 45.

Pixel definition layer 76 has a trench in which the pixel definition layer is removed. A portion of leakage-mitigating structure 70 is formed in trench 80 and therefore is not covered by pixel definition layer 76. Undercut 102-2 in trench 80 therefore causes discontinuities in one or more of OLED layers 45 (similar to as shown in detail in FIG. 6). Cathode 54 remains continuous over pixel definition layer 76 and leakage-mitigating structure 70.

Figure 10:
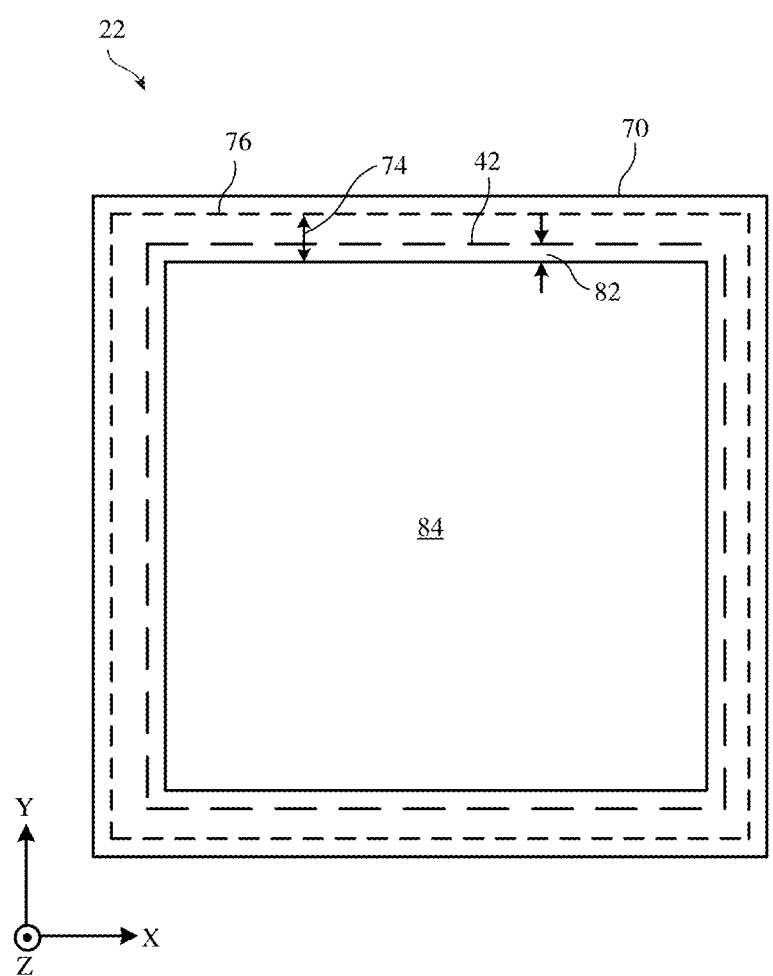
FIG. 10 is a top view of an illustrative pixel with a leakage-mitigating structure of the type shown in FIG. 6 in accordance with an embodiment.

FIG. 10 is a top view showing a pixel with a leakage-mitigating structure of the type shown in FIG. 6. The outline of anode 42 is shown by a dashed line. The anode fills the center of the pixel between the area defined by the dashed line. Leakage-mitigating structure 70 (depicted by two solid lines defining the opposing edges of the structure) partially overlaps anode 42. As shown, anode 42 and leakage-mitigating structure 70 overlap in region 82. In the example of FIG. 10, leakage-mitigating structure 70 completely laterally surrounds a light emitting area 84 of pixel 22 (e.g., completely surrounds in the XY-plane). Leakage-mitigating structure 70 may sometimes be referred to as a ring because the structure is formed in a ring around the anode and encloses the light-emitting area of the pixel. Said another way, leakage-mitigating structure 70 has a central opening through which light from the pixel is emitted.

An edge of pixel definition layer 76 is depicted in FIG. 10 by a dashed line. The dashed line illustrates the edges of an opening in the pixel definition layer that is occupied by anode 42 and leakage-mitigating structure 70. The pixel definition layer may include material that laterally surrounds the opening of FIG. 10. As shown, the pixel definition layer may at least partially overlap leakage-mitigating structure 70 (as shown in FIG. 6). However, the pixel definition layer may be separated from the edge of the leakage-mitigating structure 70 by distance 74 (similar to as shown in FIG. 6). The pixel definition layer 76 may optionally overlap a portion of the anode or may not overlap any portion of the anode. In FIG. 10, leakage-mitigating structure 70 overlaps anode 42 and at least partially defines light-emitting area 84.

Figure 11:
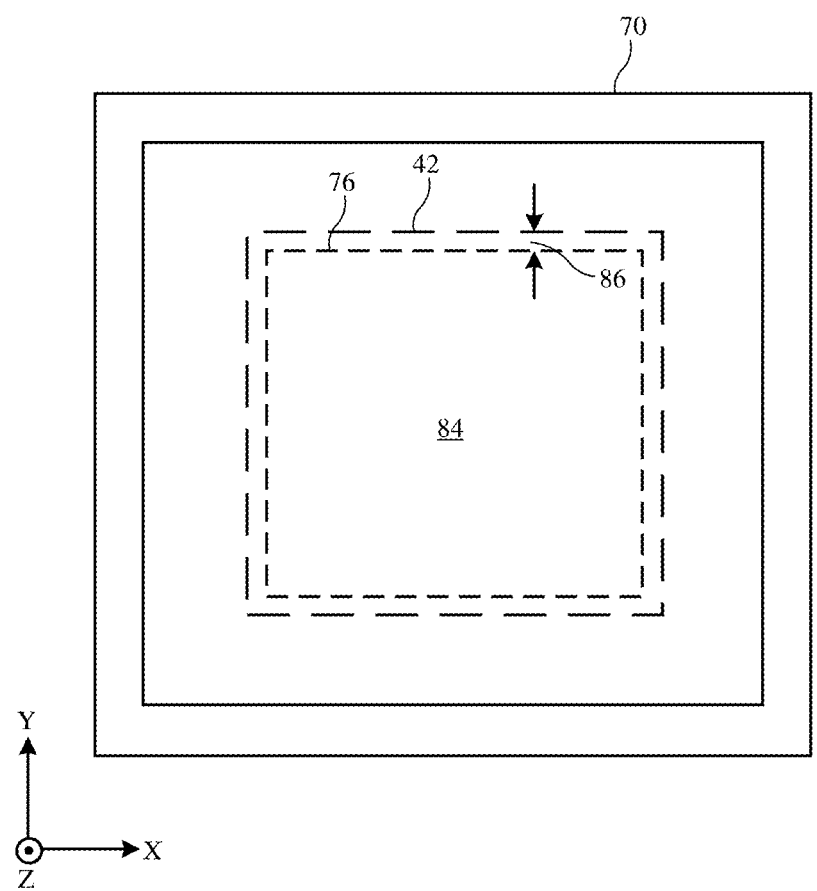
FIG. 11 is a top view of an illustrative pixel with a leakage-mitigating structure of the type shown in FIG. 7, FIG. 8, or FIG. 9 in accordance with an embodiment.

FIG. 11 is a top view showing a pixel with a leakage-mitigating structure of the type shown in FIG. 7, FIG. 8, or FIG. 9. The outline of anode 42 is shown by a dashed line. The anode fills the center of the pixel between the area defined by the dashed line. An edge of pixel definition layer 76 is depicted in FIG. 11 by a dashed line. The dashed line for pixel definition layer 76 illustrates the edges of an opening in the pixel definition layer that is occupied by anode 42. In FIG. 11, pixel definition layer 76 overlaps anode 42 and at least partially defines light-emitting area 84. Pixel definition layer 76 overlaps anode 42 in region 86. The pixel definition layer may include material that laterally surrounds the opening of FIG. 11.

Leakage-mitigating structure 70 (depicted by two solid lines defining the opposing edges of the structure) is separated from the edge of pixel definition layer 76 and anode 42. In the example of FIG. 11, leakage-mitigating structure 70 completely laterally surrounds a light emitting area 84 of pixel 22 (e.g., completely surrounds in the XY-plane). Leakage-mitigating structure 70 may sometimes be referred to as a ring because the structure is formed in a ring around the anode and encloses the light-emitting area of the pixel. Said another way, leakage-mitigating structure 70 has a central opening through which light from the pixel is emitted.

To summarize, in FIG. 10, leakage-mitigating structure 70 is formed directly on the anode and at least partially defines the light-emitting area of the pixel. Pixel definition layer 76 is set back from the inner edge of the leakage-mitigating structure. In FIG. 11, pixel definition layer 76 is formed directly on the anode and at least partially defines the light-emitting area of the pixel. Leakage-mitigating structure 70 is set back from the inner edge of the pixel definition layer. In both FIGS. 10 and 11, leakage-mitigating structure 70 may form a ring that encloses the light-emitting area of the pixel.

Figure 12:
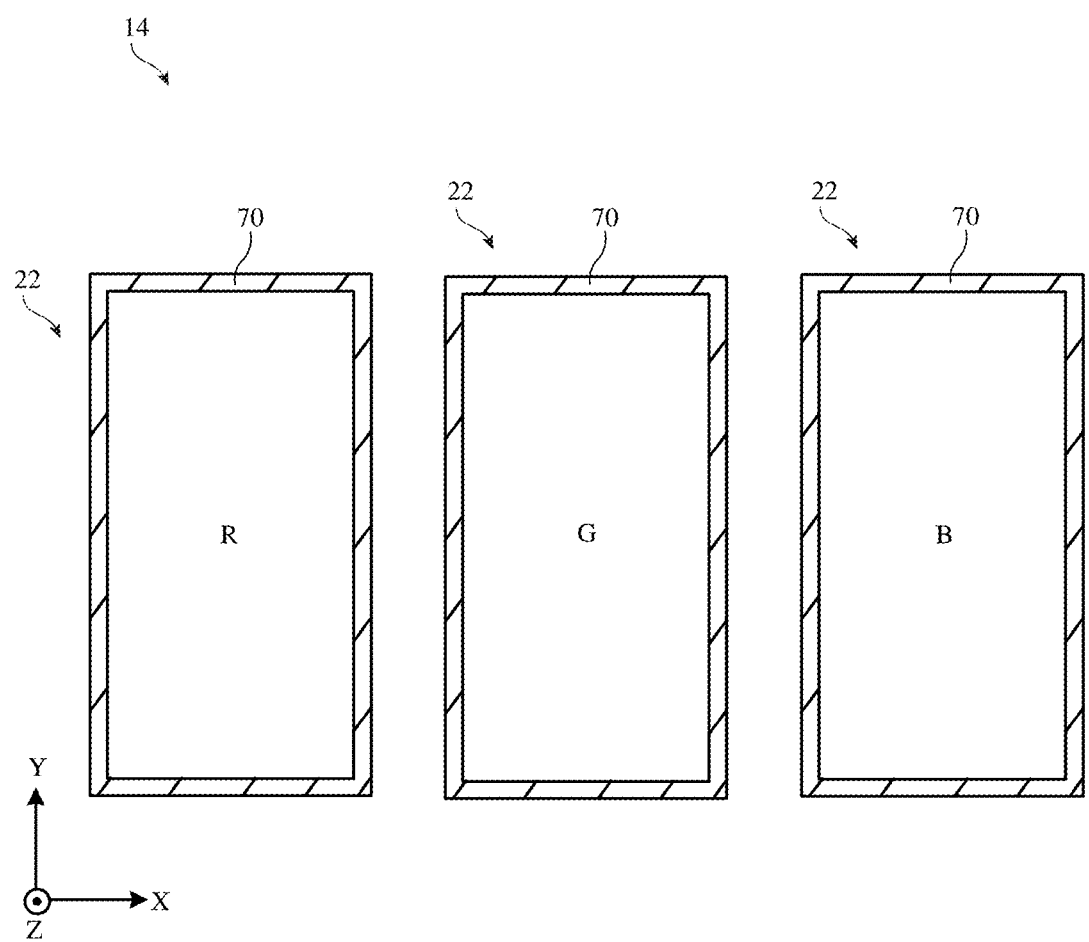
FIG. 12 is a top view of an illustrative display showing how every pixel may be enclosed by a respective leakage-mitigating structure in accordance with an embodiment.

FIG. 12 is a top view of an illustrative display showing how each pixel 22 may have a corresponding leakage-mitigating structure 70. As shown, the display may include pixels of different colors such as red pixels (R), green pixels (G), and blue pixels (B). In the example of FIG. 12, the pixels of every color have a respective leakage-mitigating structure 70 that forms a ring around that pixel. In other words, there is a 1:1 ratio between pixels and leakage-mitigating structures.

It should be noted that different pixels may have different associated OLED stackups with different OLED stackup thicknesses. Accordingly, the discontinuities caused by leakage-mitigating structure 70 may vary depending on the color of the pixel. In one possible embodiment, each color pixel may have a leakage-mitigating structure 70 that is optimized for its particular stackup. In other words, red pixels may have leakage-mitigating structures having first dimensions, green pixels may have leakage-mitigating structures having second dimensions that are different than the first dimensions, and blue pixels may have leakage-mitigating structures having third dimensions that are different than the first and second dimensions. Each color's leakage-mitigating structure may be optimized for its particular OLED layers. This type of arrangement may, however, increase the manufacturing cost and complexity of the device. Therefore, to mitigate cost and complexity, in other embodiments every pixel may have a leakage-mitigating structure of the same dimensions (regardless of the color of the pixel). The pixels of different colors may have slightly different discontinuities in their respective OLED pixels. However, the leakage-mitigating structure may cause discontinuities that sufficiently reduce lateral leakage in all of the colors of pixel in the display.

Figure 13:
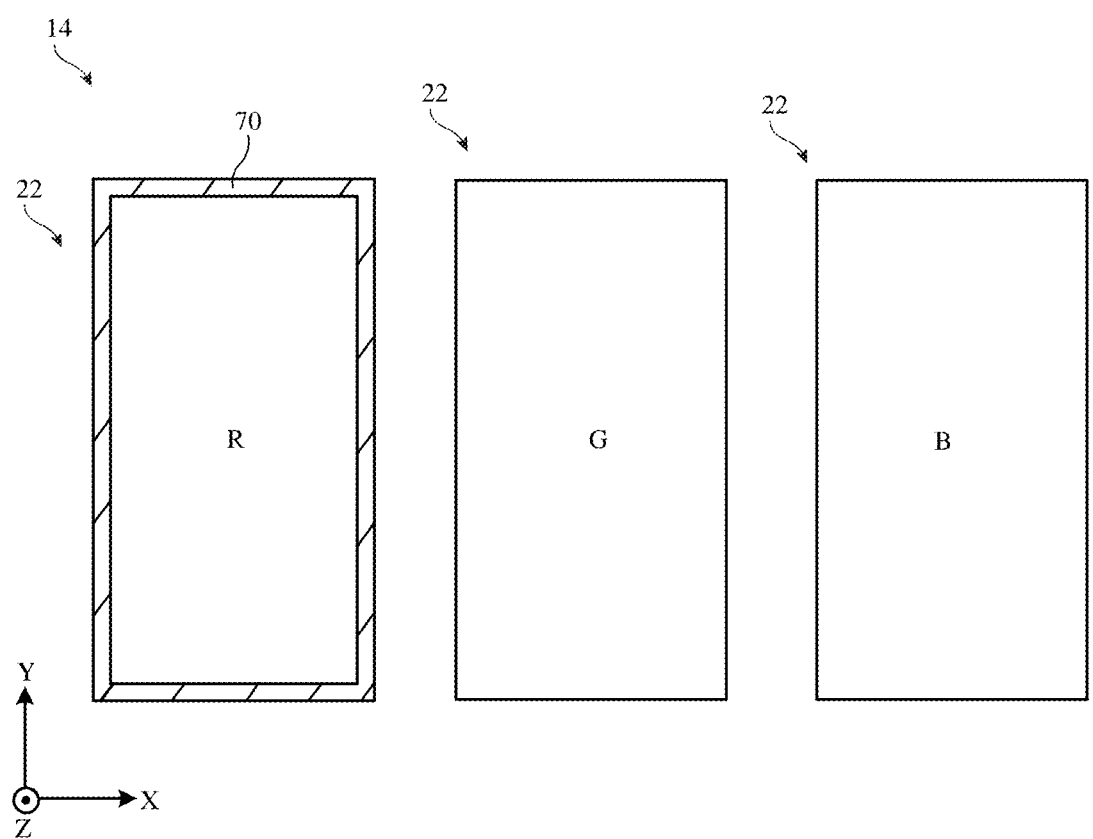
FIG. 13 is a top view of an illustrative display showing how only pixels of a given color may be enclosed by a respective leakage-mitigating structure in accordance with an embodiment.

In another example, shown in FIG. 13, only some pixels in the display may have an associated leakage-mitigating structure. As shown in FIG. 13, the red pixel has an associated leakage-mitigating structure but the green and blue pixels do not. This pattern may hold across the display. In other words, all of the red pixels in the display may have leakage-mitigating structures while all of the green and blue pixels in the display may not have leakage-mitigating structures.

The example of only the red pixels having leakage-mitigating structures is merely illustrative. In other embodiments, only the green pixels may have leakage-mitigating structures or only the blue pixels may have leakage-mitigating structures. As yet another possibility, any two pixel colors may have leakage-mitigating structures while the remaining pixel color does not.

Each pixel color may have a corresponding turn-on voltage. The turn-on voltages for different colored pixels may be different. In one example, the turn-on voltage for the red pixels may be lower than the turn-on voltages for the green and blue pixels. The pixels with a low turn-on voltage are more susceptible to visible artifacts caused by leakage current. The leakage-mitigating structures may therefore enclose only pixels of the color having the lowest turn-on voltage (e.g., only the red pixels as in FIG. 13).

The arrangements of FIGS. 12 and 13 may apply to leakage-mitigating structures formed on the anode (as in FIG. 6) or leakage-mitigating structures not formed on the anode (as in FIG. 7, 8, or 9).

Figure 14:
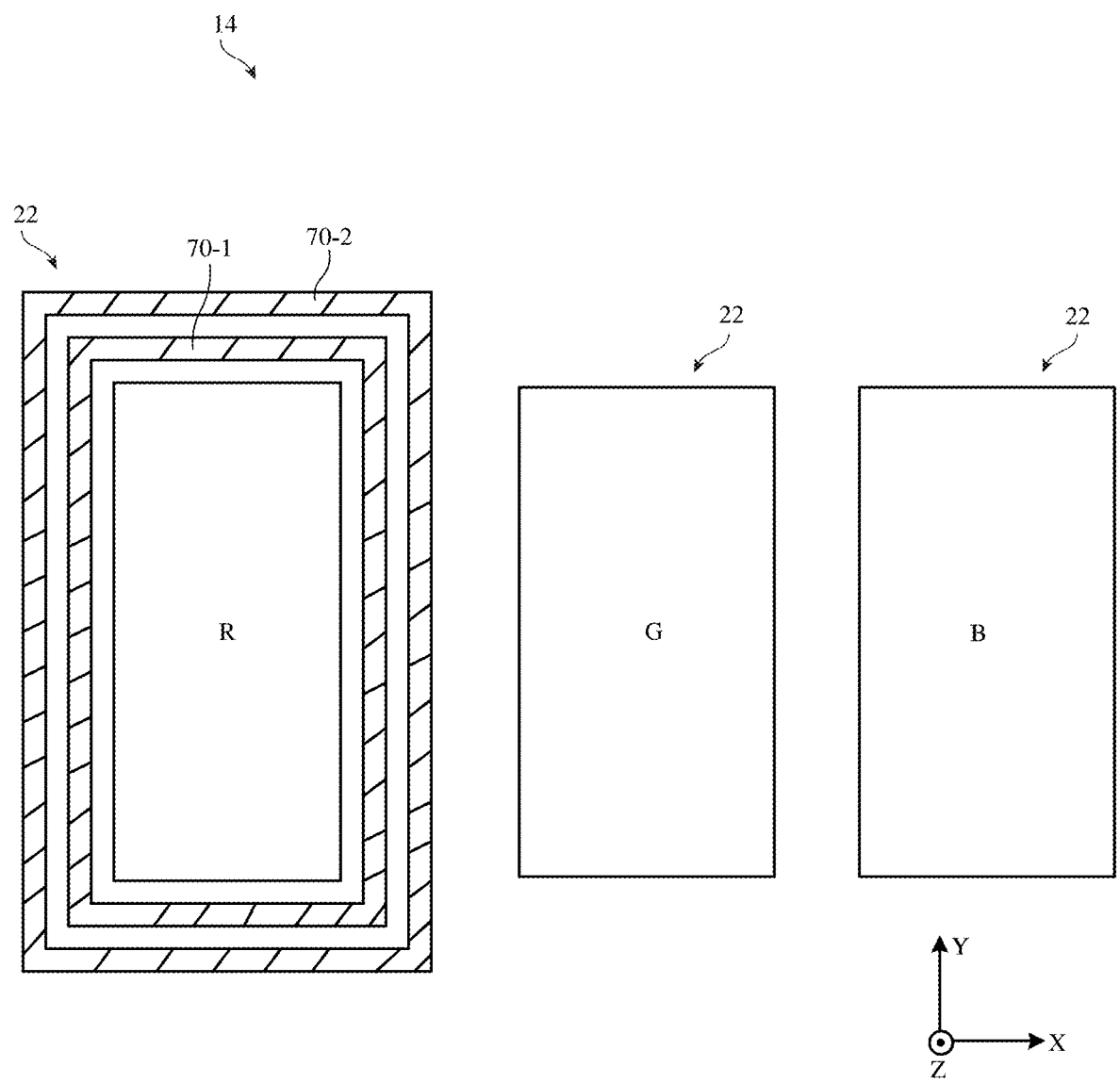
FIG. 14 is a top view of an illustrative display showing how a pixel may be enclosed by two respective leakage-mitigating structures in accordance with an embodiment.

As show in FIG. 14, a single pixel may have two respective leakage-mitigating structures. The red pixel in FIG. 14 has a first leakage-mitigating structure 70-1 that forms a ring around the light-emitting area of the pixel. The pixel also includes a second leakage-mitigating structure 70-2 that forms a ring around the light-emitting area of the pixel and the first leakage-mitigating structure 70-1. Forming multiple leakage-mitigating structures around a single pixel may improve leakage reduction in some embodiments. Leakage-mitigating structure 70-2 in FIG. 14 may not be formed on the anode (as in FIG. 7, 8, or 9). Leakage-mitigating structure 70-1 in FIG. 14 may be formed on the anode (as in FIG. 6) or may not be formed on the anode (as in FIG. 7, 8, or 9).

Figure 15:
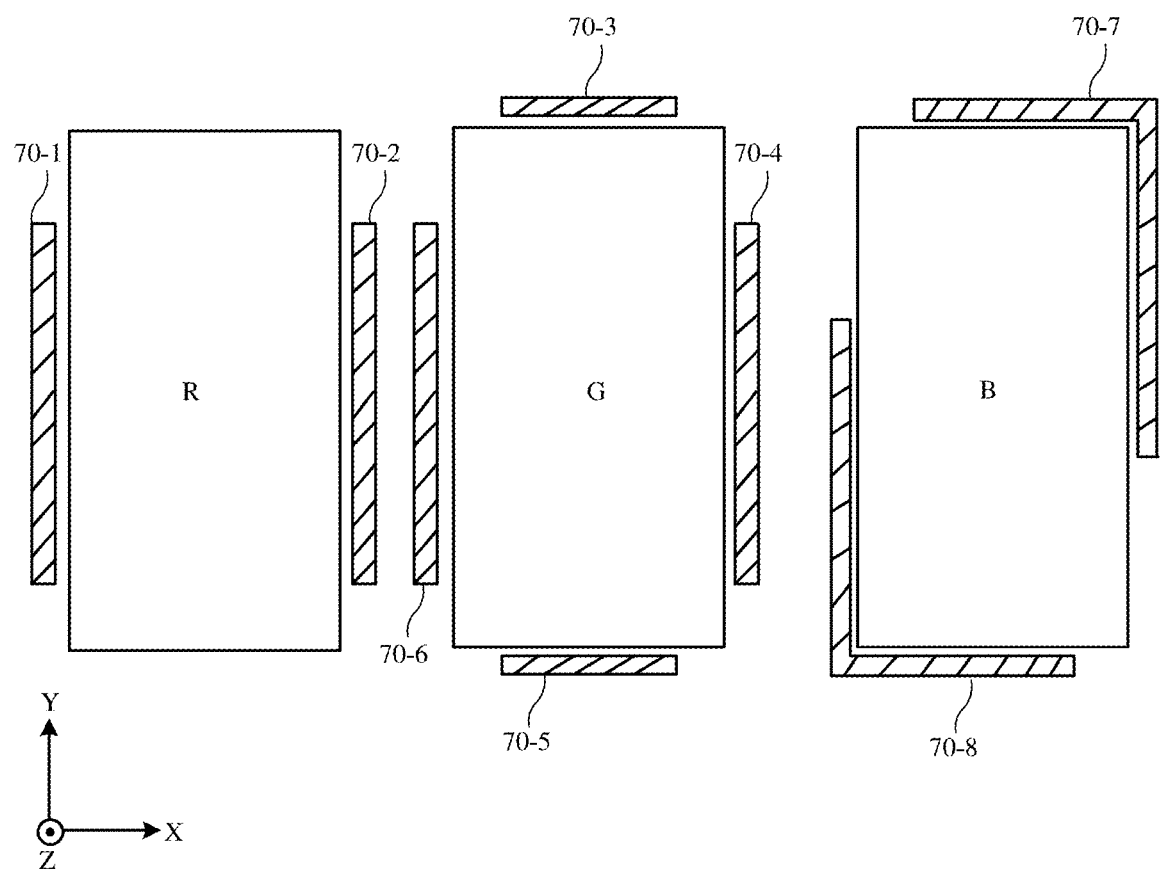
FIG. 15 is a top view of an illustrative display showing how a pixel may be only partially surrounded by leakage-mitigating structures in accordance with an embodiment.

In FIGS. 10-14, examples are shown where the leakage-mitigating structure completely encloses a respective light-emitting area of a pixel. This is merely illustrative. In some embodiments, multiple leakage-mitigating structure segments may be formed around a pixel without completely enclosing the pixel. As shown in FIG. 15, the red pixel has discrete leakage-mitigating structures 70-1 and 70-2 (sometimes referred to as leakage-mitigating structure segments)

on first and second opposing sides of the pixel. However, the leakage-mitigating structure segments 70-1 and 70-2 do not extend along the entire height of the pixel. Additionally, no leakage-mitigating structure segments are formed above or below the pixel (e.g., on third and fourth opposing sides of the pixel between the first and second opposing sides). Therefore, the light-emitting area for the red pixel is not completely enclosed by the leakage-mitigating structures.

The green pixel in FIG. 15 has discrete leakage-mitigating structures 70-4 and 70-6 (sometimes referred to as leakage-mitigating structure segments) on first and second opposing sides of the pixel. The green pixel also includes leakage-mitigating structures 70-3 and 70-5 on third and fourth opposing sides of the pixel. However, each one of leakage-mitigating structure segments 70-3, 70-4, 70-5, and 70-6 does not extend along its entire respective pixel side. Therefore, the light-emitting area for the green pixel is not completely enclosed by the leakage-mitigating structures.

The blue pixel in FIG. 15 has discrete leakage-mitigating structures 70-7 and 70-8 that each have orthogonal portions that conform to a corner of the pixel. However, leakage-mitigating structures 70-7 and 70-8 do not extend along the entire pixel to completely enclose the pixel. Therefore, the light-emitting area for the blue pixel is not completely enclosed by the leakage-mitigating structures.

Each pixel may have leakage-mitigating structures that completely enclose that pixel or one or more leakage-mitigating structures that only partially enclose that pixel (e.g., as in one of the examples of FIG. 15). Every pixel of the same color may have the same leakage-mitigating structure arrangement. Alternatively, different pixels of the same color may have different leakage-mitigating structure arrangements if desired. The arrangements of FIG. 15 may apply to leakage-mitigating structures formed on the anode (as in FIG. 6) or leakage-mitigating structures not formed on the anode (as in FIG. 7, 8, or 9).

Figure 16:
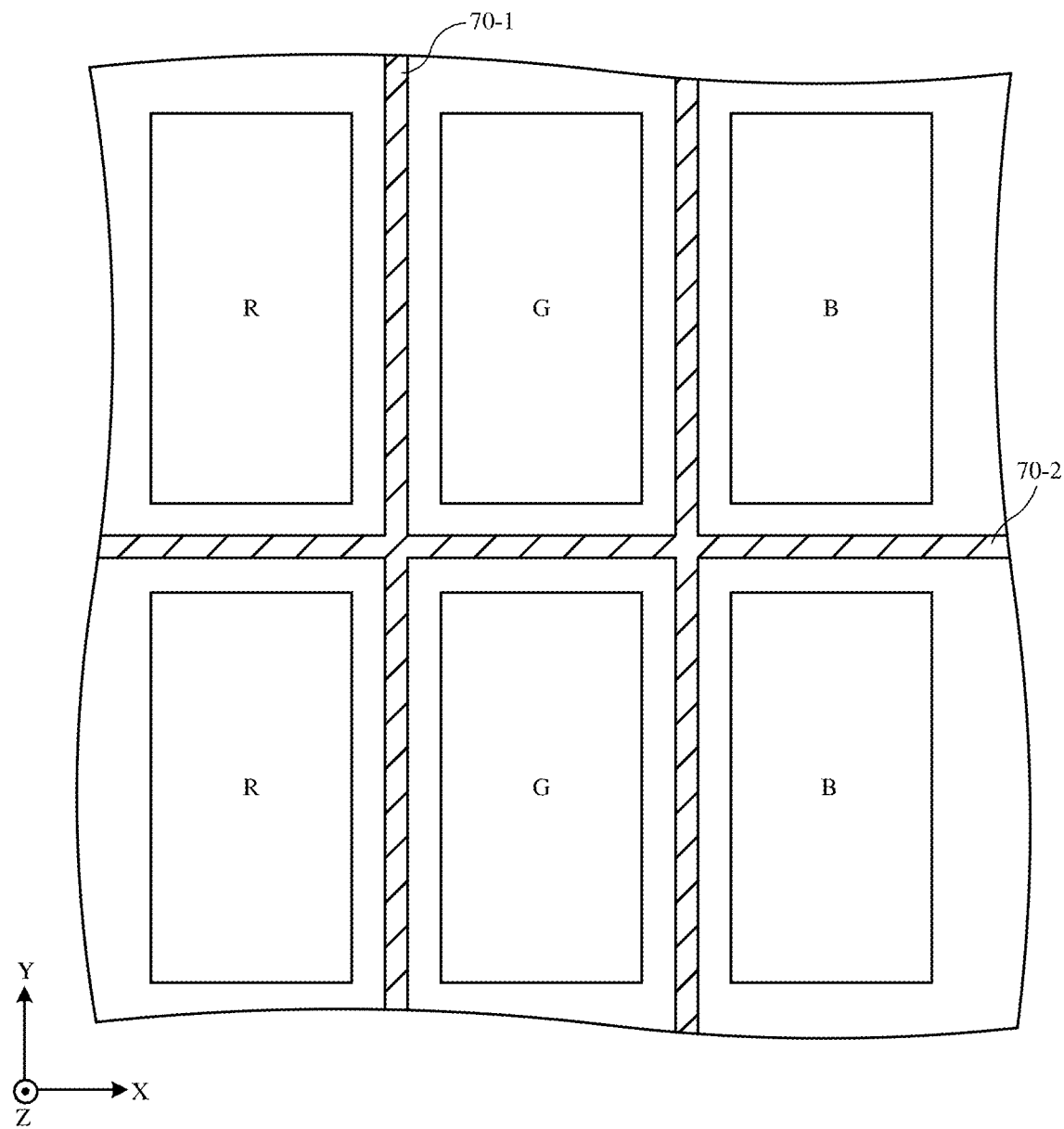
FIG. 16 is a top view of an illustrative display showing how a grid of leakage-mitigating structures may be formed between the array of pixels in accordance with an embodiment.

In FIG. 12, each pixel is enclosed by a respective leakage-mitigating structure that forms a ring around the pixel. Consequently, there are two leakage-mitigating structures interposed between adjacent pixels (e.g., there are two leakage-mitigating structures between the red and green pixels in FIG. 12). In another alternative, shown in FIG. 16, there may be only one leakage-mitigating structure interposed between adjacent pixels. As shown, some leakage-mitigating structures 70-1 may extend vertically (e.g., parallel to the Y-axis and columns of pixels in the display) across the display. Some leakage-mitigating structures 70-2 may extend horizontally (e.g., parallel to the X-axis and rows of pixels in the display) across the display. The leakage-mitigating structure may combine to form a grid that encloses each pixel with a ring of leakage-mitigating structure portions. However, only one leakage-mitigating structure is interposed between each adjacent pair of pixels. The arrangements of FIG. 16 may apply to leakage-mitigating structures formed on the anode (as in FIG. 6) and/or leakage-mitigating structures not formed on the anode (as in FIG. 7, 8, or 9).

These layout examples is merely illustrative. In some cases, there may be some pixels with dedicated leakage-mitigating structure rings (as in FIGS. 12 and 13) and some pixels that are partially or completely surrounded by leakage-mitigating structures formed by rows and columns of leakage-mitigating structures (as in FIG. 16).

In FIGS. 6-9, examples of passive leakage-mitigating structures are shown. The passive leakage-mitigating structures are simply physical structures that cause discontinuities in one or more overlying OLED layers during deposition of the OLED layers. The passive leakage-mitigating structures require no power consumption or active control during operation of the display.

Active leakage-mitigating structures may also be included in the display. The active leakage-mitigating structures may include a conductive layer (e.g., a conductive ring) that drains leakage current to ground. Alternatively, the active leakage-mitigating structures may include a gate electrode modulator with a variable voltage that stops the current flow laterally.

Figure 17:
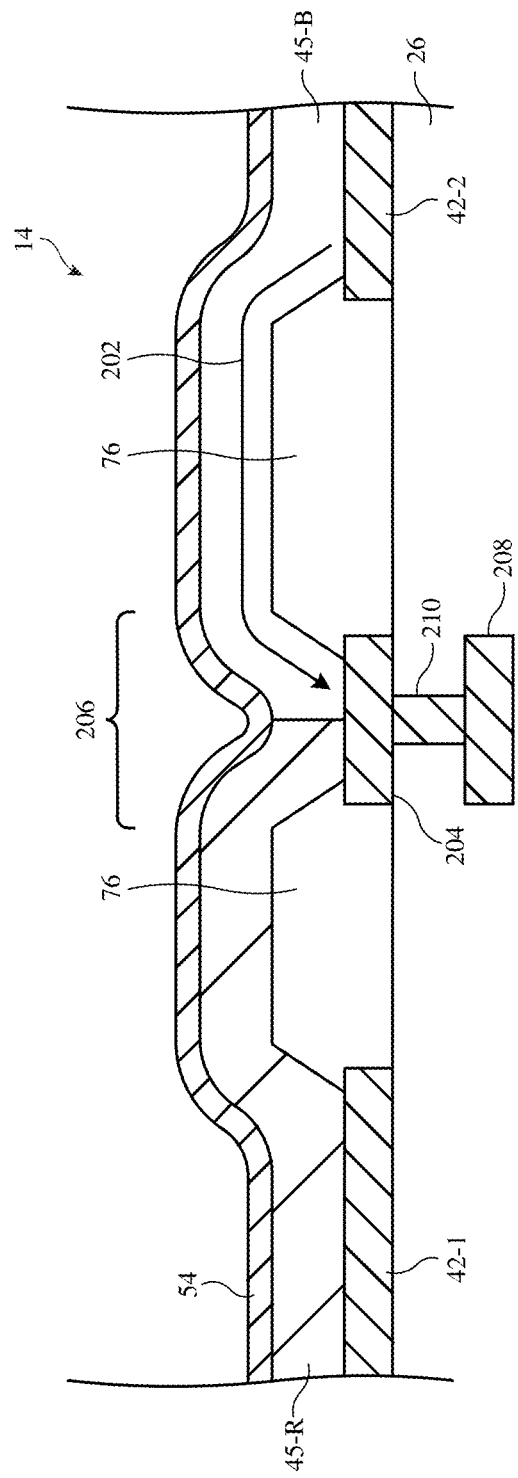
FIG. 17 is a cross-sectional side view of an illustrative organic light-emitting diode display having a guard ring on a substrate that serves as a current sink to mitigate lateral leakage in accordance with an embodiment.

FIG. 17 is a cross-sectional side view of a display with a conductive ring 204 that serves as an active leakage-mitigating structure. In FIG. 17, a first pixel with a first anode 42-1 is positioned adjacent to a second pixel with a second anode 42-2. Each anode may have associated OLED layers 45. In FIG. 17, anode 42-1 has associated OLED layers 45-R configured to emit red light. Anode 42-2 has associated OLED layers 45-B configured to emit blue light.

Consider an example where anode 42-2 is turned on so that OLED layers 45-B emit blue light. The red pixel formed by anode 42-1 and OLED layers 45-R, meanwhile, is intended to remain off. A leakage current 202 is generated when anode 42-2 is turned on. Without conductive ring 204 (sometimes referred to as guard 204, current sink 204, etc.), the leakage current may reach OLED layers 45-R and cause red light to be (undesirably) emitted.

Conductive ring 204 may be coupled to a bias voltage such as ground, such that the conductive ring serves as a current sink. Accordingly, leakage current 202 reaches conductive ring 204 and is drained (instead of causing undesirable leakage emissions).

Pixel definition layer 76 may define a light-emitting area associated with each pixel. The pixel definition layer 76 may extend between adjacent pixels. As shown in FIG. 17, a trench such as trench 206 may be formed in the pixel definition layer between anodes 42-1 and 42-2. Trench 206 (sometimes referred to as opening 206 or recess 206) results in a portion of conductive ring 204 not being covered by the pixel definition layer. This results in conductive ring 204 being exposed through the pixel definition layer and directly contacting OLED layers 45-R/45-B. Including trench 206 such that the OLED layers 45 are directly contacting (shorted to) the conductive ring 204 enables conductive ring 204 to serve as a leakage current sink.

Conductive ring 204 may be coupled to a bias voltage to enable the conductive ring to serve as a current sink. The magnitude of the bias voltage may be selected to optimize leakage current mitigation and power requirements. In one embodiment, the bias voltage may be ground (e.g., ELVSS in FIG. 3). In this case, conductive ring 204 may be electrically connected to a negative (ground) power supply line that provides negative (ground) power supply voltage ELVSS. Conductive ring 204 may be connected to the same negative power supply line that provides negative power supply voltage ELVSS to cathode 54.

The example of coupling conductive ring 204 to a ground power supply voltage is merely illustrative. In another possible embodiment, the bias voltage for conductive ring 204 may be greater than ELVSS. The conductive ring may be more effective at reducing lateral leakage as the bias voltage is increased closer to the turn-on voltage for the pixels. For example, the red pixels may have an associated turn-on voltage. The red pixel turn-on voltage may be lower than the green and blue pixel turn-on voltage. The bias voltage for the conductive ring may be approximately equal to (e.g., within 5% of, within 10% of, within 20% of, etc.) the turn-on voltage for the red pixels. Where ground is 0V, the bias voltage of the conductive ring may be equal to (e.g., greater than ground by) 0V, more than 0.2V, more than 0.4V, more than 0.6V, more than 0.8V, more than 1.0V, more than 1.2V, more than 1.4V, more than 1.5V, between 1 and 1.5V, between 1 and 2V, between 1.4V and 1.6V, etc. Increasing the bias voltage relative to ground in this manner may improve leakage mitigation with the tradeoff of increased power consumption.

In one example, shown in FIG. 17, conductive ring 204 may be coupled to an additional metal layer 208 within substrate 26 using conductive via 210. Metal layer 208 may provide the bias voltage to conductive ring 204. Metal layer 208 may be part of a source drain metal layer used to form other portions of the display pixels (e.g., a source or drain terminal for a thin-film transistor for the display). The metal layer 208 may receive the bias voltage from gate driving circuitry and/or display driving circuitry in the display. Metal layer 208 may be a negative power supply line. These examples are merely illustrative. Via 210 may optionally be omitted and conductive ring 204 may be provided the bias voltage without being shorted to metal layer 208. Conductive ring 204 may be coupled to a power voltage supply line or another signal line (e.g., provided by the display driver circuitry and/or gate driver circuitry) to receive the appropriate bias voltage. In other words, the conductive ring 204 is connected to a signal line at the periphery of the display and no vias are used in the active area.

In FIG. 17, conductive ring 204 is exposed at a trench portion of pixel definition layer 76. Portions of the pixel definition layer overlap some but not all of conductive ring 204. This example is merely illustrative.

Figure 18:
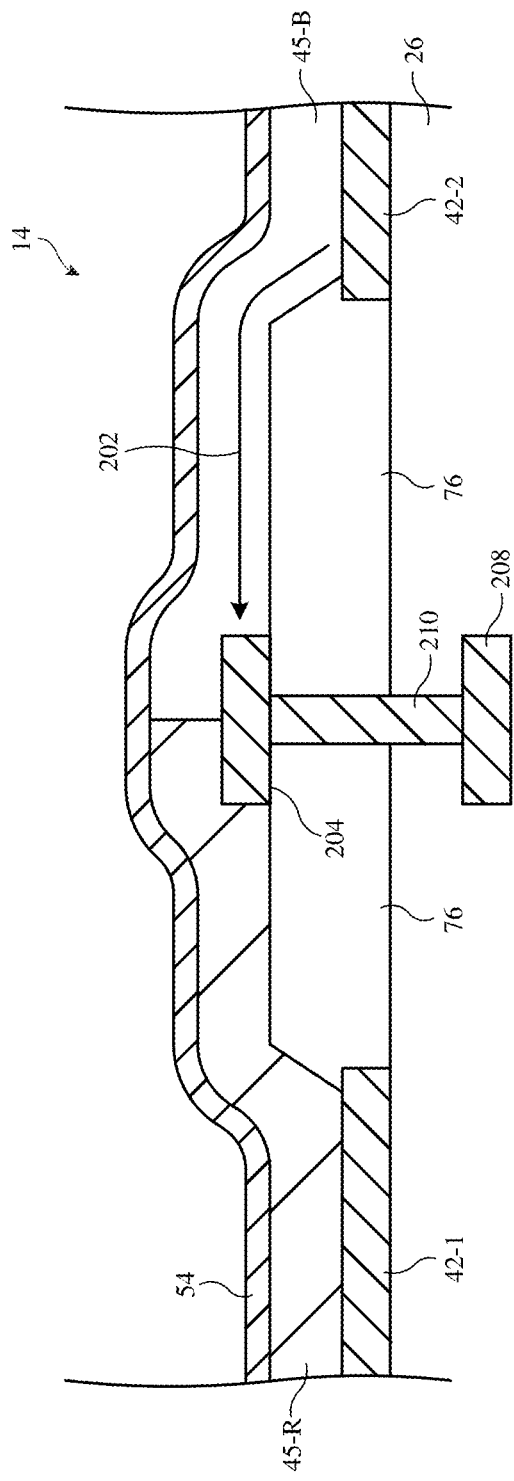
FIG. 18 is a cross-sectional side view of an illustrative organic light-emitting diode display having a guard ring on a pixel definition layer that serves as a current sink to mitigate lateral leakage in accordance with an embodiment.

FIG. 18 shows an alternate embodiment where conductive ring 204 is formed over the pixel definition layer 76. Conductive ring 204 is formed directly on the upper surface of pixel definition layer 76. The conductive ring 204 is coupled to a bias voltage (as discussed in connection with FIG. 17) to serve as a current sink for leakage current 202. Conductive ring 204 is still in direct contact with OLED layers 45-R and 45-B in FIG. 18.

As with FIG. 17, the conductive ring 204 in FIG. 18 may optionally be coupled to metal layer 208 using conductive via 210 to receive the bias voltage. Conductive via 210 in FIG. 18 passes through both portions of substrate 26 and pixel definition layer 76.

There are many possible layouts for the guard structure 204 of FIGS. 17 and 18. Each pixel may be enclosed by a respective guard structure (similar to as shown in FIG. 12), the pixels may have guard structures formed in segments that do not entirely enclose the pixel (similar to as shown in FIG. 15), multiple guard structures may surround a single pixel (similar to as shown in FIG. 14), or the guard structures may form a grid that separates the pixels (similar to as in FIG. 16). In yet another possible embodiment, only some pixels (e.g., pixels of one color but not the other colors) may be enclosed by the guard structures.

Figure 19:
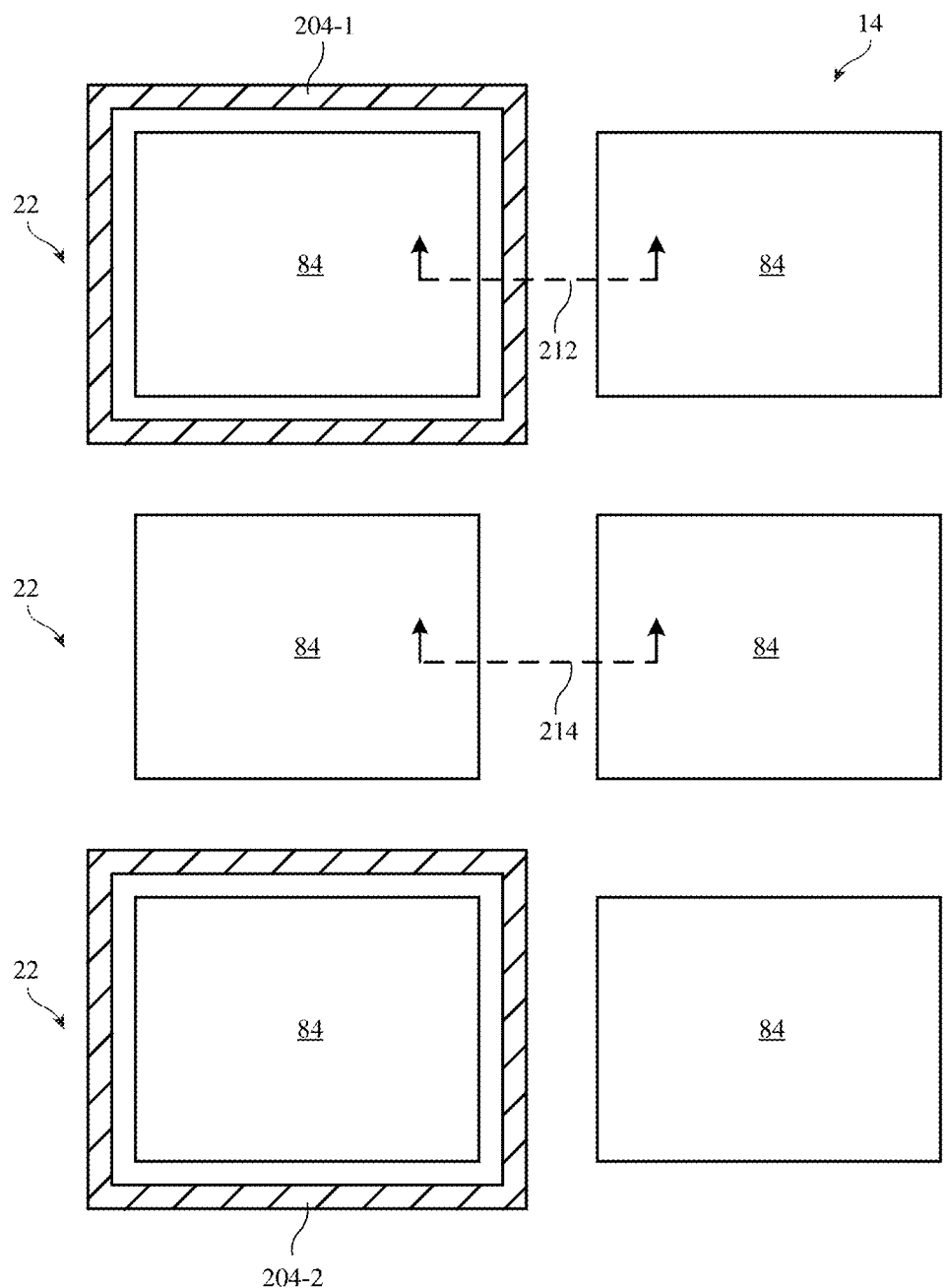
FIG. 19 is a top view of an illustrative display showing how only some of the pixels in the array may be enclosed by a respective guard ring in accordance with an embodiment.

FIG. 19 is a top view showing how some but not all pixels in the display may be enclosed by guard structures. Each pixel has a corresponding light-emitting area 84. A first pixel is enclosed by guard structure 204-1. A second pixel is enclosed by guard structure 204-2. The remaining four pixels in FIG. 19 are not enclosed by a guard structure.

In this type of arrangement, it may still be desirable to electrically connect guard structures 204-1 and 204-2 (so that they may easily be provided the same bias voltage). A conductive layer may optionally be provided to electrically connect the guard structures.

Figure 20:
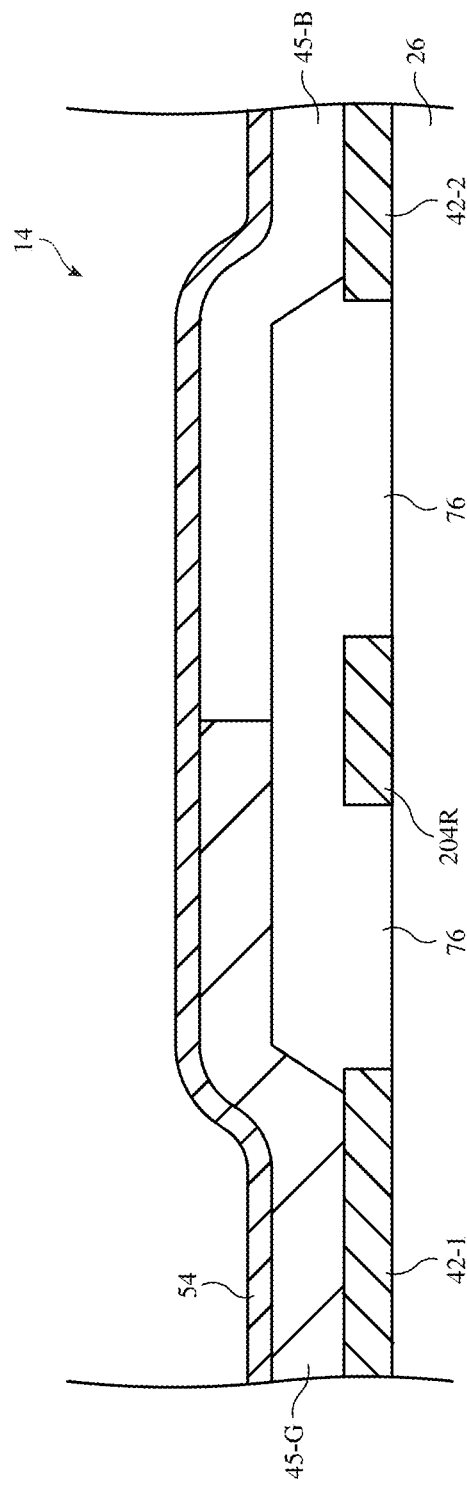
FIG. 20 is a cross-sectional side view of an illustrative organic light-emitting diode display showing how conductive routing may electrically connect the guard rings in accordance with an embodiment.
Figure 21:
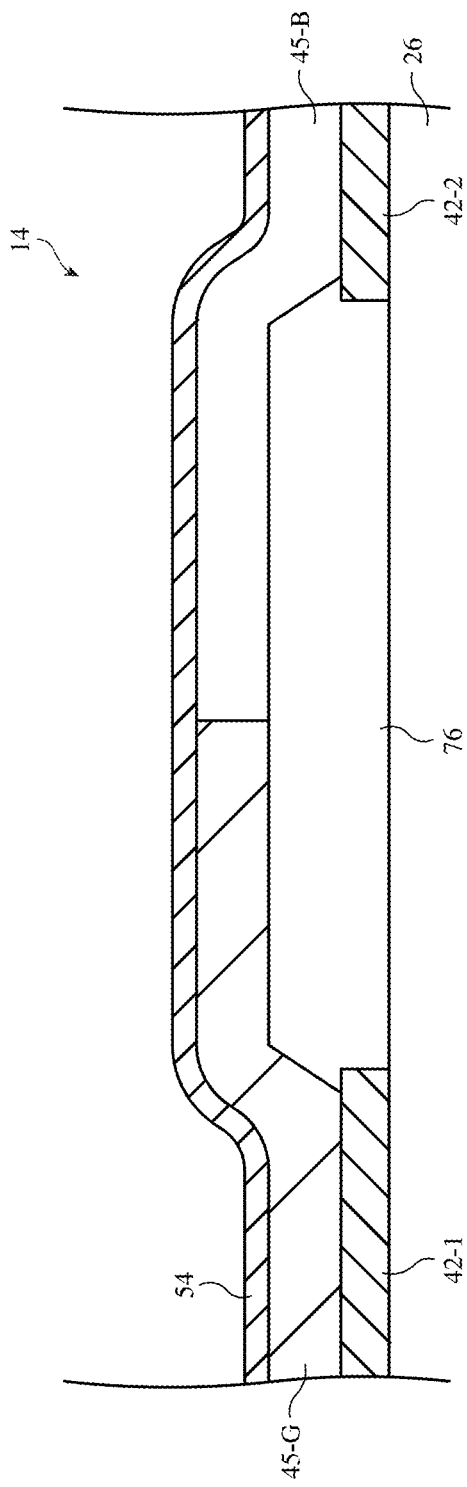
FIG. 21 is a cross-sectional side view of an illustrative organic light-emitting diode display showing how the guard rings may be omitted between some adjacent anodes in accordance with an embodiment.

FIGS. 17 and 18 show illustrative cross-sectional views taken along line 212 in FIG. 19. In other words, these figures show an example of a single guard structure interposed between adjacent anodes in the display. FIGS. 20 and 21 show illustrative cross-sectional views taken along line 214 in FIG. 19.

In FIG. 20 (taken along line 214 in FIG. 19), a routing portion 204-R is formed between adjacent anodes 42-1 and 42-2. The routing portion 204-R is formed on substrate 26 and is covered by pixel definition layer 76. The pixel definition layer 76 may conform to and directly contact the upper surface of routing portion 204-R. Routing portion 204-R (which may be conductive and formed from the same metal layer as guard structures 204-1 and 204-2) may be biased to the same bias voltage as guard structures 204-1 and 204-2 in FIG. 19. However, because routing portion 204-R is covered by pixel definition layer 76 and therefore separated from the OLED layers 45, the routing portion 204-R does not serve as a current sink and only routes the bias voltage between guard structures 204-1 and 204-2.

In another example, shown in FIG. 21, the conductive layer 204 is omitted entirely between anodes 42-1 and 42-2 (i.e., there are neither routing portions or current sink portions present). In this example, pixel definition layer 76 extends between anodes 42-1 and 42-2 without an intervening portion of conductive layer 204.

Figure 22:
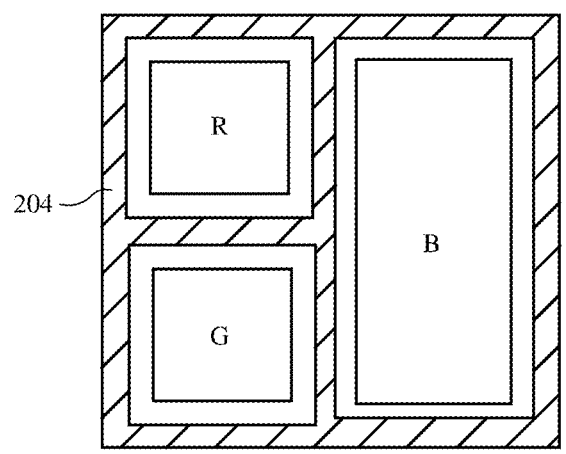
FIG. 22 is a top view of an illustrative display with each pixel being enclosed by a respective guard ring in accordance with an embodiment.
Figure 23:
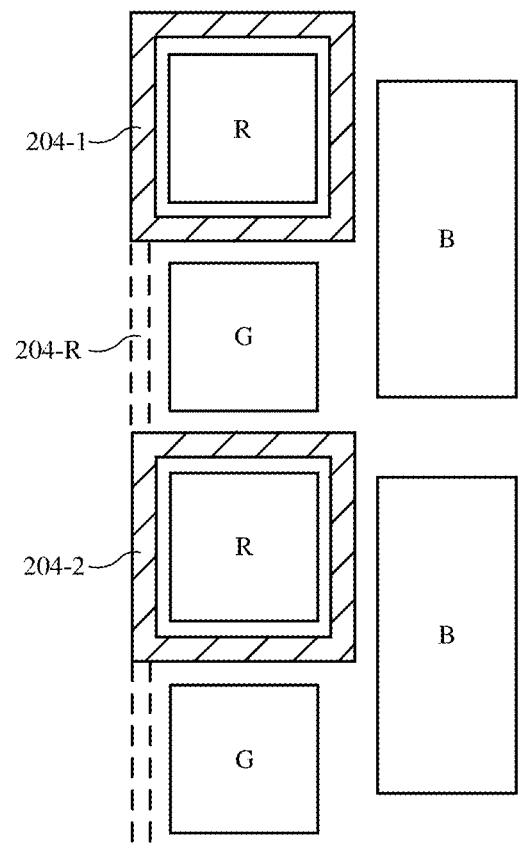
FIG. 23 is a top view of an illustrative display showing some of the pixels enclosed by respective guard rings and routing structures between the guard rings in accordance with an embodiment.

FIG. 22 is a top view of a display showing an example where conductive guard 204 is formed as a grid between the pixels. Each pixel is completely laterally enclosed by portions of conductive guard 204. In FIG. 23, only the red pixels are enclosed by the conductive guards. As discussed in connection with FIG. 13, the example of red pixels being the only color enclosed is merely illustrative. However, it may be desirable to enclose the pixels having the lowest turn-on voltage with conductive guards.

As shown, a first red pixel is enclosed by a respective conductive guard 204-1, a second red pixel is enclosed by a respective conductive guard 204-2, etc. The conductive guards 204-1 and 204-2 may have a cross-sectional structure of the type shown in FIG. 17 or FIG. 18. Between conductive guards 204-1 and 204-2 may be a routing portion 204-R having a cross-sectional structure of the type shown in FIG. 20. Alternatively, routing portion 204-R may be omitted (e.g., as in FIG. 21) and conductive guards 204-1 and 204-2 may receive the bias voltage through other means (e.g., metal layers within substrate 26).

Figure 24:
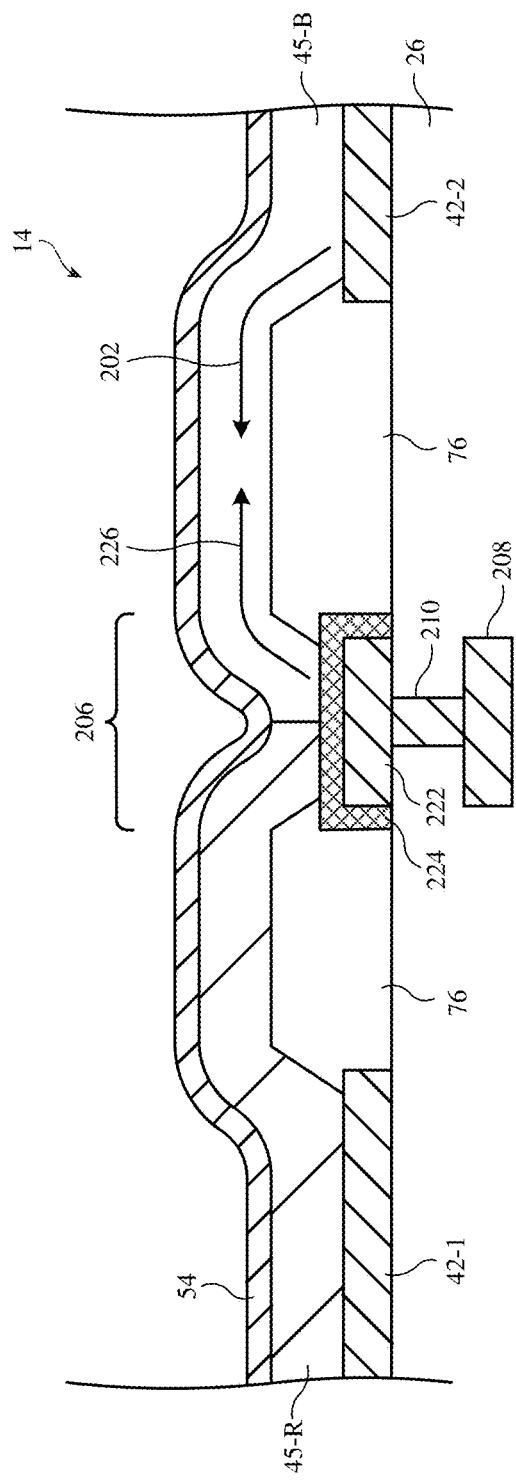
FIG. 24 is a cross-sectional side view of an illustrative organic light-emitting diode display having a gate electrode modulator on a substrate that generates a leakage-mitigating current in accordance with an embodiment.

FIG. 24 is a cross-sectional side view of a display where the active leakage-mitigating structures include a gate electrode modulator with a variable voltage that stops the current flow laterally. FIG. 24, a first pixel with a first anode 42-1 is positioned adjacent to a second pixel with a second anode 42-2. Each anode may have associated OLED layers 45. In FIG. 24, anode 42-1 has associated OLED layers 45-R configured to emit red light. Anode 42-2 has associated OLED layers 45-B configured to emit blue light. A conductive gate 222 is formed between anodes 42-1 and 42-2.

Consider an example where anode 42-2 is turned on so that OLED layers 45-B emit blue light. The red pixel formed by anode 42-1 and OLED layers 45-R, meanwhile, is intended to remain off. A leakage current 202 is generated when anode 42-2 is turned on. Without conductive gate 222, the leakage current may reach OLED layers 45-R and cause red light to be (undesirably) emitted.

Conductive gate 222 may be coupled to a gate voltage such that the conductive gate forms a gate electrode. Applying the gate voltage to conductive gate 222 generates a large electric field and a corresponding mitigating current 226 that prevents leakage current 202 from reaching the red pixel and emitting red light. Conductive gate 222 therefore serves as an active leakage-mitigating structure for the display.

Conductive gate 222 may be covered by gate insulator 224. Gate insulator 224 may conform to and completely cover the conductive gate (e.g., to both the upper surface and sidewalls of conductive gate 222). The gate insulator prevents conductive gate 222 from being shorted to OLED layers 45. Gate insulator may be formed from a thin, high-k dielectric material (e.g., a material having a high dielectric constant). The gate insulator may be formed from silicon dioxide, silicon nitride, hafnium dioxide, aluminum oxide, or any other desired material.

Pixel definition layer 76 may define a light-emitting area associated with each pixel. The pixel definition layer 76 may extend between adjacent pixels. As shown in FIG. 24, a trench such as trench 206 may be formed in the pixel definition layer between anodes 42-1 and 42-2. Trench 206 (sometimes referred to as opening 206 or recess 206) results in a portion of gate 222 and gate insulator 224 not being covered by the pixel definition layer. This results in conductive gate 222 being able to create a high electric field in OLED layers 45.

Conductive gate 222 be coupled to a variable voltage to enable the conductive gate to serve as a gate electrode modulator. The variable voltage may optionally switch between two different values. To mitigate leakage current, a high voltage that is higher than the turn-on voltage of the red, blue, and green pixels may be applied to conductive gate 222. When this high voltage is applied, the gate electrode modulator creates a high electric-field and thus a high potential barrier between pixels, which stops leakage current flow between pixels. The gate voltage applied to conductive gate 222 may be greater than 3V, greater than 5V, greater than 6V, greater than 7V, greater than 8V, between 5V and 8V, less than 10V, less than 8V, less than 7V, between 5V and 7V, etc. A low voltage may also sometimes be provided to conductive gate when a high electric field is not required to mitigate leakage current.

Conductive gate 222 may optionally be coupled to metal layer 208 using conductive via 210 to receive the gate voltage. Conductive via 210 in FIG. 24 passes through portions of substrate 26. Metal layer 208 may have additional portions that form display pixel components, may be a signal line, etc. (as discussed in connection with FIG. 17)

Figure 25:
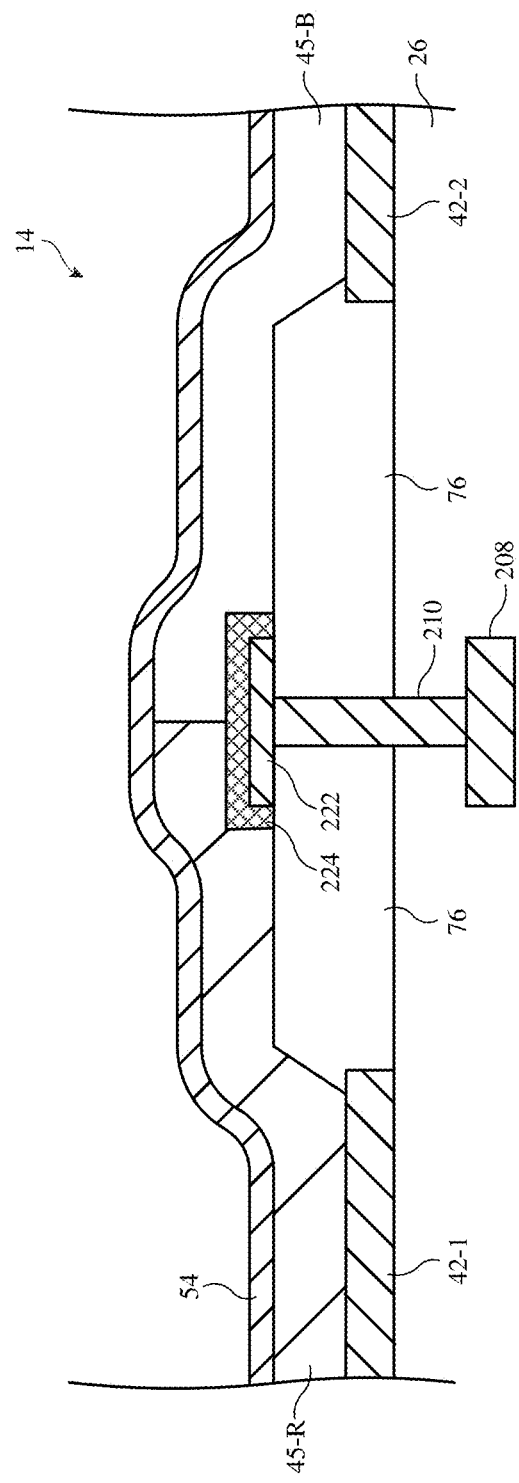
FIG. 25 is a cross-sectional side view of an illustrative organic light-emitting diode display having a gate electrode modulator on a pixel definition layer that generates a leakage-mitigating current in accordance with an embodiment.

FIG. 25 shows an alternate embodiment where conductive gate 222 is formed over pixel definition layer 76. Conductive gate 222 is formed directly on the upper surface of pixel definition layer 76. Gate insulator 224 is formed over conductive gate 222. The conductive gate is coupled to a variable gate voltage (as discussed in connection with FIG. 24) to serve as a gate electrode modulator. Gate insulator 224 is in direct contact with OLED layers 45-R and 45-B in FIG. 25.

As with FIG. 24, the conductive gate 222 in FIG. 25 may optionally be coupled to metal layer 208 using conductive via 210 to receive the gate voltage. Conductive via 210 in FIG. 25 passes through both portions of substrate 26 and pixel definition layer 76.

Figure 26:
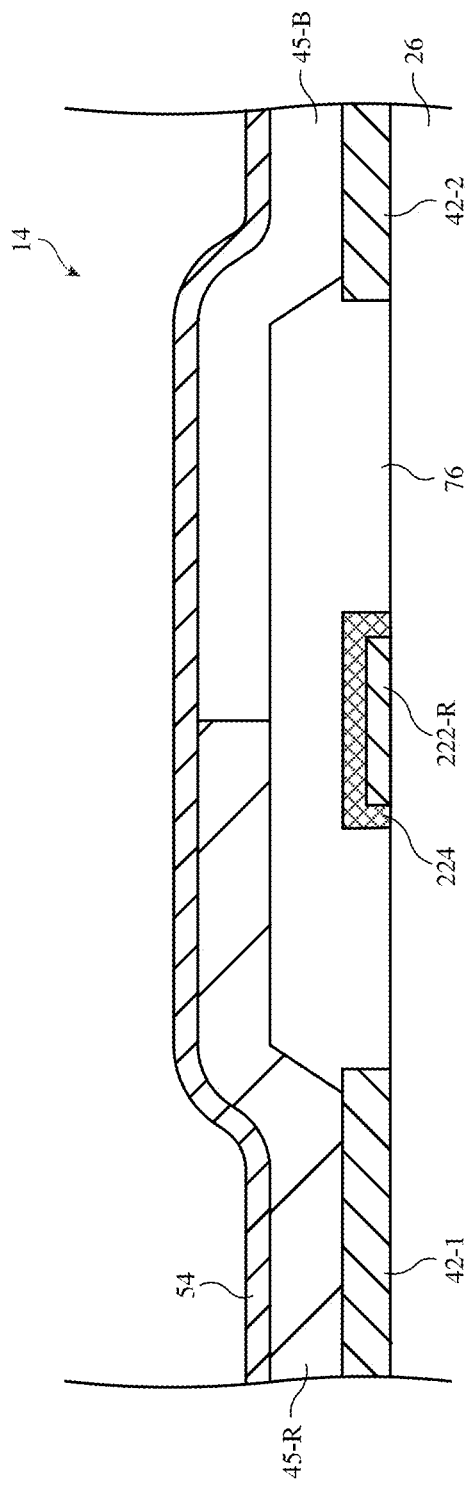
FIG. 26 is a cross-sectional side view of an illustrative organic light-emitting diode display showing how conductive routing may electrically connect conductive gates in accordance with an embodiment.

FIG. 26 is a cross-sectional view showing how (similar to as in FIG. 20) the display may include may have conductive routing portions 222-R between conductive gates 222. In FIG. 26, a routing portion 222-R is formed between adjacent anodes 42-1 and 42-2. The routing portion 222-R is formed on substrate 26 and is covered by pixel definition layer 76. The pixel definition layer 76 may conform to and directly contact the upper surface of gate insulator 224 (which may still optionally be included over routing portion 222-R). Routing portion 222-R may be biased to the same gate voltage as the conductive gates it connects. However, because routing portion 222-R is covered by pixel definition layer 76 and therefore separated from the OLED layers 45, the routing portion 222-R does not serve as a gate electrode modulator and only routes the gate voltage between other conductive gates.

It should be noted that in any of FIGS. 17, 18, 24 and 25, via 210 may optionally be omitted and the conductive structure (ring 204 or gate 222) may be provided a voltage without being shorted to metal layer 208. The conductive structure may be coupled to a power voltage supply line or another signal line (e.g., provided by the display driver circuitry and/or gate driver circuitry) to receive the appropriate bias voltage. In other words, the conductive structure (guard 204 or gate 222) is connected to a signal line at the periphery of the display and no vias are used in the active area.

Figure 27A:
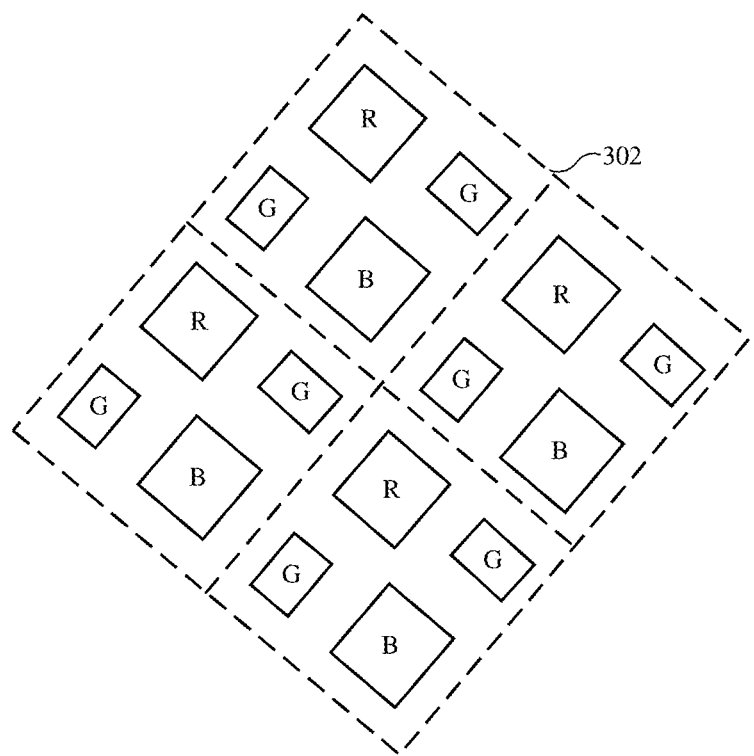
FIGS. 27A and 27B are top views of illustrative displays showing different pixel layouts in accordance with an embodiment.
Figure 27B:
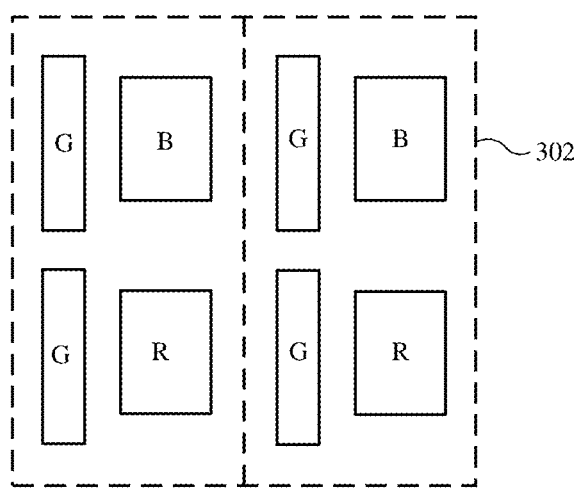

FIGS. 27A and 27B are top views showing additional possible pixel layouts for the display. Both FIGS. 27A and 27B include a repeating unit cell of pixels that includes one red pixel, one blue pixel, and two green pixels. In an alternate nomenclature, the repeating unit cell may be referred to as a pixel that includes one red sub-pixel, one blue sub-pixel, and two green sub-pixels. In FIG. 27A, the repeating unit cell 302 has two green pixels, one red pixel, and one blue pixel arranged in a diamond pattern. The green pixels may be smaller than the red and blue pixels. The red pixel may be smaller than the blue pixel. In FIG. 27A, the pixels have diamond shapes (e.g., rectangles that rotated relative to the upper edge of the display). The repeating unit cells may extend diagonally across the pixel array. This may be referred to as a pentile arrangement. In FIG. 27B, the repeating unit cell 302 has two green pixels, one red pixel, and one blue pixel arranged in a rectangular pattern. The green pixels may be smaller than the red and blue pixels. The red pixel may be smaller than the blue pixel. In contrast with FIG. 27A, the repeating unit cells of FIG. 27B may extend horizontally and vertically across the display (e.g., in stripes) instead of diagonally.

It should be noted that the gate electrodes 222 may have any of the layouts discussed in connection with the guard structure 204 (e.g., the layout of FIG. 19, FIG. 22, FIG. 23, etc.). Additionally the active leakage-mitigating structures of FIGS. 17-26 may have any of the layouts described relative to the passive leakage-mitigating structures (e.g., the active leakage-mitigating structures of FIGS. 17-26 may have any of the layouts of FIGS. 12-16).

Figure 28A:
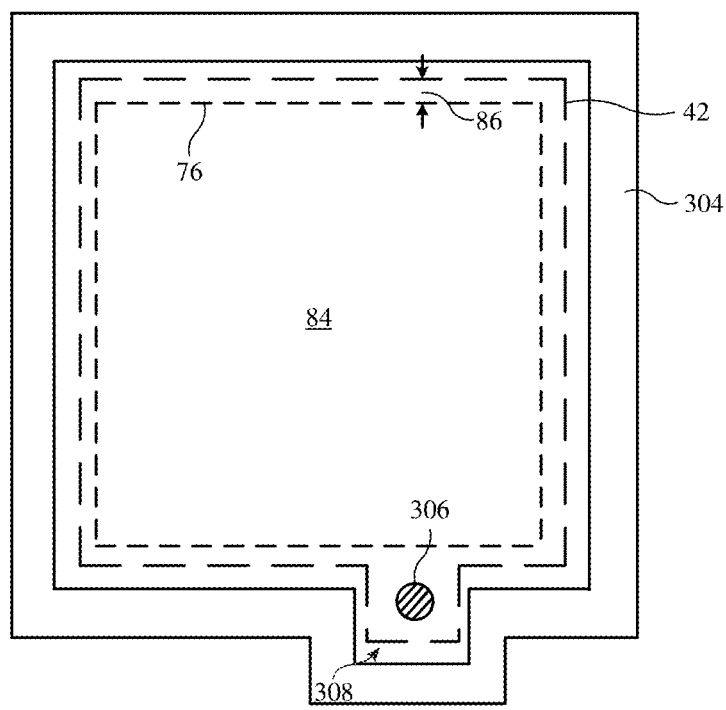
FIGS. 28A and 28B are top views of illustrative pixels having anode extensions and contacts and corresponding leakage-mitigating structures in accordance with an embodiment.
Figure 28B:
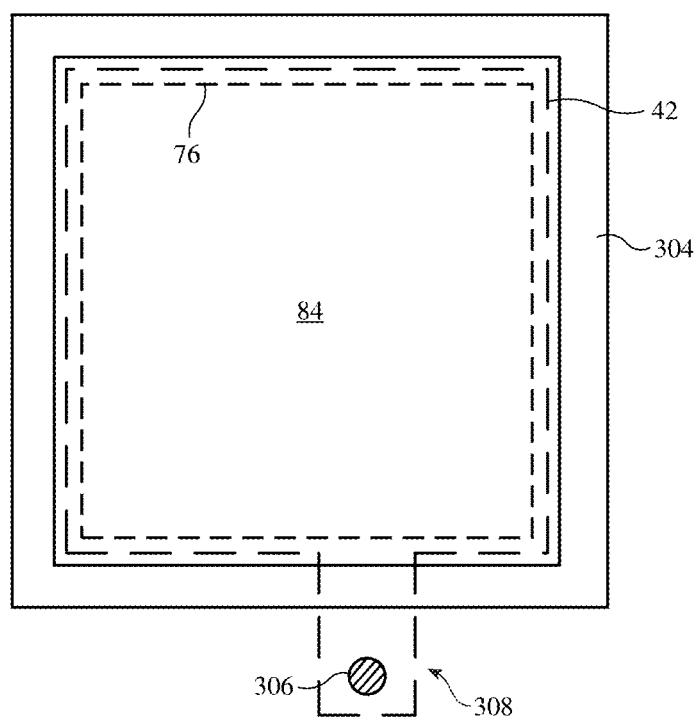

FIGS. 28A and 28B show different options for routing leakage-mitigating structures when a contact hole is present. In FIG. 28A, the outline of anode 42 is shown by a dashed line. The anode fills the center of the pixel between the area defined by the dashed line. The anode additionally has an extension 308 (sometimes referred to as tab 308 or protrusion 308) that is electrically connected to contact hole 306 (sometimes referred to as contact 306 or via 306). Contact 306 may be a via that electrically connects the anode to thin-film transistor circuitry in the substrate. The anode may overlap and be electrically connected to contact 306. Positioning contact 306 outside of the light-emitting area 84 (as in FIGS. 28A and 28B) may allow the pixel size to be maximized and improve off-angle uniformity.

An edge of pixel definition layer 76 is depicted in FIG. 28A by a dashed line. The dashed line for pixel definition layer 76 illustrates the edges of an opening in the pixel definition layer that is occupied by anode 42. In FIG. 28A, pixel definition layer 76 overlaps anode 42 and at least partially defines light-emitting area 84. Pixel definition layer 76 overlaps anode 42 in region 86 (e.g., around the periphery of the anode). Pixel definition layer 76 may also overlap extension 308 and contact 306. The pixel definition layer may include material that laterally surrounds the opening of FIG. 28A.

Leakage-mitigating structure 304 (depicted by two solid lines defining the opposing edges of the structure) is separated from the edge of pixel definition layer 76 and anode 42. Leakage-mitigating structure 304 completely laterally surrounds a light emitting area 84 of pixel 22 (e.g., completely surrounds in the XY-plane). Said another way, leakage-mitigating structure 304 has a central opening through which light from the pixel is emitted. In the example of FIG. 28A, leakage-mitigating structure 304 is routed around extension 308 such that leakage-mitigating structure 304 and extension 308 (as well as contact 306) are non-overlapping.

Alternatively, FIG. 28B shows another example where leakage-mitigating structure 304 overlaps extension 308 and is routed between contact 306 and the main portion of anode 42. A portion of pixel definition layer 76 is interposed between extension 308 and leakage-mitigating structure 304 in the overlap area to electrically isolate extension 308 and leakage-mitigating structure 304.

Leakage-mitigating structure 304 may not directly overlap contact 306 to avoid an undesired morphology or tilt from the contact region and to prevent any potential short between the leakage-mitigating structure 304 and contact 306.

Leakage-mitigating structure 304 in FIGS. 28A and 28B may be a passive leakage-mitigating structure (e.g., of the type shown in FIGS. 7-9) or an active leakage-mitigating structure (e.g., of the type shown in FIG. 17, 18, or 24-26).

The aforementioned concepts may be applied to pixels having any desired layout. The pixels may be arranged in a pentile layout (as in FIG. 27A), in stripes (e.g., similar to as in FIG. 16 or in FIG. 27B), similar to as in FIGS. 22 and 23, or in any other desired layout.

The aforementioned concepts may be applied to pixels having OLED layers that form a single diode (as in FIG. 5A) or OLED layers that form a tandem diode (as in FIG. 5B).

The aforementioned concepts may involve depositing additional layers for the display (e.g., to form the leakage-mitigating structures). If desired, a protection layer over the anode may be used during manufacturing to reduce the impact of deposition steps on the anode surface morphology. Plasma related processes such as chemical vapor deposition (CVD) or dry-etching may have the potential to damage the anode surfaces. Therefore, a protection layer (such as a molybdenum layer) may be formed over the anode during processing. The protection layer may be removed by wet etching prior to OLED layer deposition over the anode. However, some of the protection layer (e.g., portions that are interposed between the anode and overlying layers) may remain even after the wet etching removal step. For example, a thin molybdenum layer may be interposed between (and in direct contact with) portion 70-3 of leakage-mitigating structure 70 and the anode 42 in FIG. 6 (e.g., in position 92 in FIG. 6). A thin molybdenum layer may be interposed between (and in direct contact with) pixel definition layer 76 and the anode 42 in FIGS. 7-9, 17, 18, 20, 21, 24, 25, and 26 (e.g., in position 94 in FIG. 7).

Figure 29:
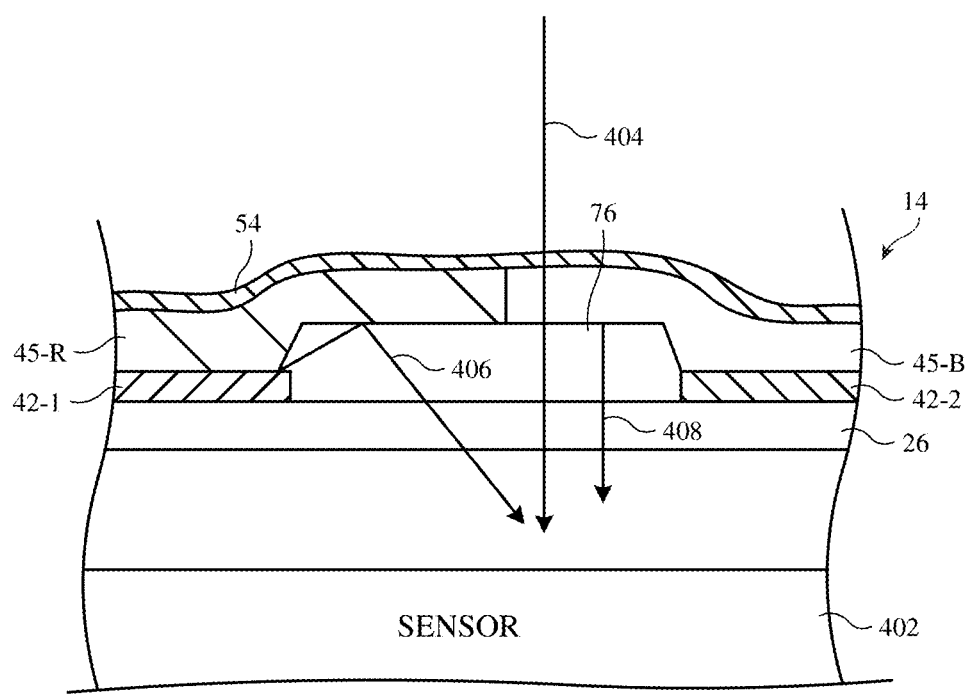
FIG. 29 is a cross-sectional side view of an illustrative display showing how an optical sensor may be positioned under the display in accordance with an embodiment.

FIG. 29 is a cross-sectional side view of an illustrative electronic device showing how a sensor may be positioned below display 14. The sensor may be, for example, an optical sensor such as an ambient light sensor that senses ambient light 404 through display 14. Ideally, ambient light sensor 402 would receive only ambient light 404 (to maximize the signal-to-noise ratio of the sensor). However, in practice, ambient light sensor 402 may also receive light generated by the pixels of display 14.

As shown, display 14 may include a substrate 26. Substrate 26 may be formed from glass, plastic, polymer, silicon, or any other desired material. Anodes such as anodes 42-1 and 42-2 may be formed on the substrate. In FIG. 29, anode 42-1 has associated OLED layers 45-R configured to emit red light. Anode 42-2 has associated OLED layers 45-B configured to emit blue light. Pixel definition layer 76 is formed over substrate 26 between anodes 42-1 and 42-2. Pixel definition layer 76 may conform to and overlap the edges of anodes 42-1 and 42-2.

There are at least two ways in which light from the OLED pixels may (undesirably) reach sensor 402. First, some of the pixel-generated light may become trapped in pixel definition layer 76, as shown by path 406. The pixel definition layer 76 may form a waveguide that traps light in the pixel definition layer until it escapes towards sensor 402. Second, the pixels may generate back-emission light that travels in direction 408 towards sensor 402. Lateral leakage current (as discussed in connection with FIG. 4, for example), may increase the amount of back emission that reaches sensor 402.

Light from both the waveguide effect 406 and back emission 408 may decrease the signal-to-noise ratio of sensor 402. Moreover, these effects may be transient and difficult to account for using compensation techniques (because there is a delay between the display being updated and the corresponding noise-causing-light reaching sensor 402).

To prevent display light from undesirably reaching a sensor below the display, first and second leakage-mitigating structures 70 may be positioned on substrate 26 between a first anode 42-1 for a first pixel and a second anode 42-2 for a second pixel. Each leakage-mitigating structure may be a structure similar to as shown in FIG. 6 (e.g., a three-layered structure), a structure similar to as shown in FIG. 8 (e.g., a two-layered structure), or a structure of any other desired shape.

Figure 30:
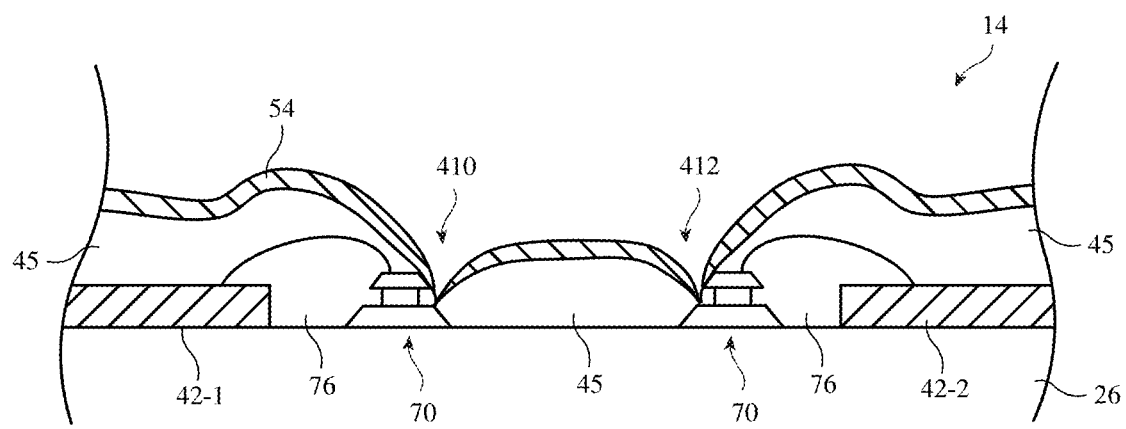
FIG. 30 is a cross-sectional side view of an illustrative display showing how leakage-mitigating structures may disrupt a pixel definition layer waveguide effect in accordance with an embodiment.

In FIG. 6, it was shown how leakage-mitigating structure 70 has an undercut 102. The undercut is a void in the leakage-mitigating structure material that is still covered by a portion of the leakage-mitigating structure. As shown in FIG. 6, undercut 102 may have a width 104 and a height 106. The dimensions of the undercut may be selected to create discontinuities in one or more of the organic light-emitting diode layers in the display (to prevent lateral leakage through the organic light-emitting diode layers). In some cases (such as in FIG. 6), the dimensions of the undercut are selected to ensure continuity of the cathode layer (and, optionally, some of the organic light-emitting diode layers in the display). In FIG. 30, each leakage-mitigating structure may only partially encircle each pixel. Therefore, in contrast to FIG. 6, the dimensions of the undercut may be selected to cause a discontinuity in the cathode layer in addition to the organic light-emitting diode layers.

For example, the height of the undercut of the leakage-mitigating structures 70 in FIG. 30 may be greater than 25 nanometers, greater than 40 nanometers, greater than 60 nanometers, greater than 70 nanometers, less than 70 nanometers, between 45 nanometers and 70 nanometers, etc. The thickness of organic light-emitting diode layers 45 may be greater than 100 nanometers, greater than 150 nanometers, greater than 200 nanometers, greater than 250 nanometers, greater than 300 nanometers, less than 300 nanometers, etc.

The height of the undercut in each leakage-mitigating structure 70 may be at least 8% of the thickness of OLED layers 45, at least 16% of the thickness of OLED layers 45, at least 30% of the thickness of OLED layers 45, at least 35% of the thickness of OLED layers 45, at least 40% of the thickness of OLED layers 45, at least 45% of the thickness of OLED layers 45, etc. In general, the greater the height of the undercut relative to the thickness of OLED layers 45, the more discontinuity (and, accordingly, lateral leakage reduction) imparted onto the layers over the leakage-mitigating structure.

As shown in FIG. 30, the first leakage-mitigating structure 70 (which partially encircles anode 42-1) may cause a first discontinuity 410 in OLED layers 45 and cathode 54 and the second leakage-mitigating structure 70 (which partially encircles anode 42-2) may cause a second discontinuity 412 in OLED layers 45 and cathode 54. Pixel definition layer 76 is formed between each anode and respective leakage-mitigating structure 70. As shown in FIG. 30, pixel definition layer 76 overlaps (and conforms to) a portion of anode 42-1 and corresponding leakage-mitigating structure 70. In other words, the pixel definition layer is formed on the top surface of the first leakage-mitigating structure 70 for anode 42-1. Similarly, pixel definition layer 76 overlaps (and conforms to) a portion of anode 42-2 and corresponding leakage-mitigating structure 70. In other words, the pixel definition layer is formed on the top surface of the second leakage-mitigating structure 70 for anode 42-2.

With the arrangement of FIG. 30, the deep discontinuities 410 and 412 prevent lateral leakage of current between anodes 42-1 and 42-2. This mitigates back emissions that undesirably reach a sensor below the display (e.g., via path 408 in FIG. 29). Positioning the leakage-mitigating structures closer to the anode minimizes back emissions from reaching the sensor. Moreover, as shown in FIG. 30, pixel definition layer 76 is omitted between the first and second leakage-mitigating structures 70 (e.g., only OLED layers 45 are present between the first and second leakage-mitigating structures). The waveguide effect of the pixel definition layer 76 is therefore disrupted, mitigating the amount of light that passes through pixel definition layer 76 to an underlying sensor (e.g., via path 406 in FIG. 29).

Creating deep discontinuities in the OLED layers 45 and cathode 54 (as in FIG. 30) may be optimal for mitigating lateral leakage in the display (and improving signal-to-noise ratio in a sensor under the display). However, the portion of the cathode 54 over each anode still needs to be electrically connected to the rest of the common cathode layer to ensure the portion of the cathode 54 over each anode is at the appropriate cathode voltage. To ensure continuity of the cathode, the leakage-mitigating structure 70 is omitted in at least one position around the perimeter of the anode. In this location, the cathode is ensured to be electrically connected between the portion over the anode and the remaining bulk of the cathode.

Figure 31:
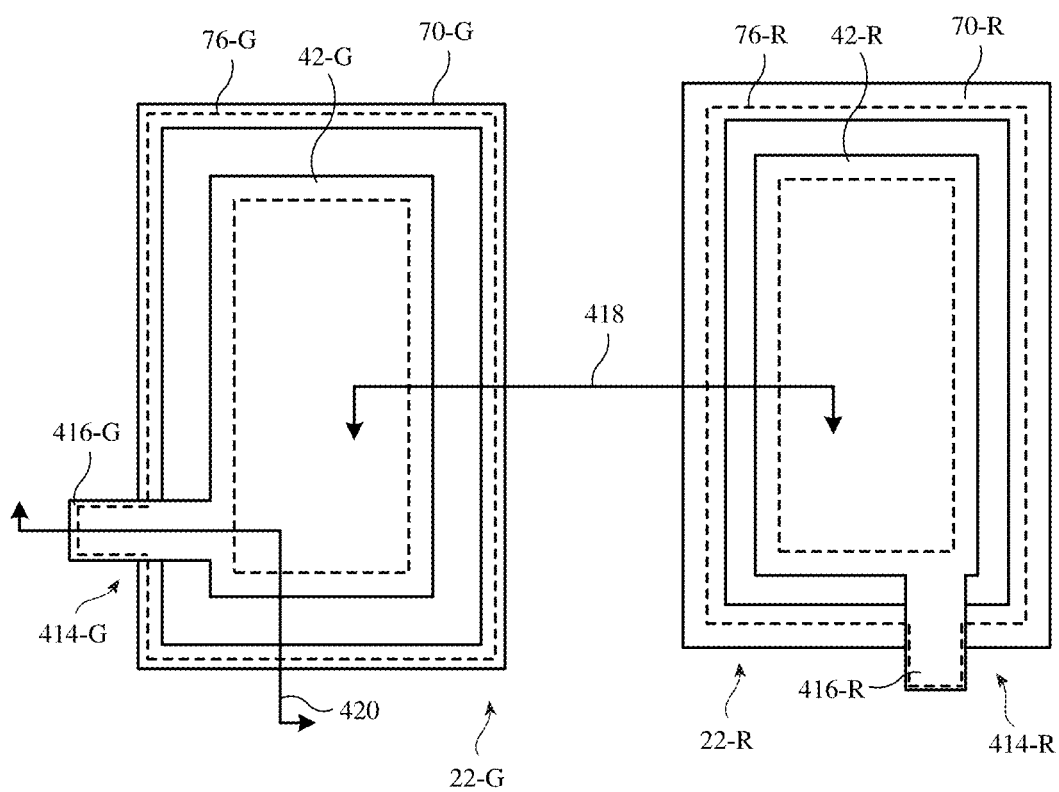
FIG. 31 is a top view of an illustrative display showing how leakage-mitigating structures may partially surround a respective anode in accordance with an embodiment.

FIG. 31 is a top view of illustrative pixels that are partially surrounded by leakage-mitigating structures 70. As shown, a first pixel 22-G is configured to emit green light and a second pixel 22-R is configured to emit red light. Pixel 22-G includes an anode 42-G, a leakage-mitigating structure 70-G, and a pixel definition layer 76-G. Pixel definition layer 76-G is represented in FIG. 31 by dashed lines. As shown, pixel definition layer 76-G partially overlaps anode 42-G and partially overlaps leakage-mitigating structure 70-G.

Leakage-mitigating structure 70-G does not completely surround anode 42-G. As shown, leakage-mitigating structure 70-G has an opening 414-G in at least one location around the perimeter of pixel 22-G (and anode 42-G and its corresponding light-emitting area). The leakage-mitigating structure 70-G therefore only partially surrounds the light-emitting aperture of pixel 22-G. Leakage-mitigating structure 70-G may extend around more than 50% of pixel 22-G (e.g., anode 42-G and its corresponding light-emitting area), more than 60% of pixel 22-G, more than 70% of pixel 22-G, more than 80% of pixel 22-G, more than 90% of pixel 22-G, more than 95% of pixel 22-G, etc. However, leakage-mitigating structure 70-G may extend around less than 100% of pixel 22-G (e.g., only partially encloses pixel 22-G).

The cathode 54 may be formed as a blanket layer over the pixels. Leakage-mitigating structure 70-G may cause a discontinuity in the cathode. In other words, the cathode may have a discontinuity having the same footprint/outline as the leakage-mitigating structure. However, the cathode may be continuous through opening 414-G in the leakage-mitigating structure. Therefore, opening 414-G preserves the required cathode continuity for the pixel.

As shown in FIG. 31, anode 42-G may optionally have an extension 416-G (sometimes referred to as tab 416-G) that overlaps with opening 414-G in leakage-mitigating structure 70-G. Extension 416-G of anode 42-G may include an anode-contact where the anode is electrically connected to thin-film transistor circuitry in the underlying substrate 26.

Pixel 22-R includes an anode 42-R, a leakage-mitigating structure 70-R, and a pixel definition layer 76-R. Pixel definition layer 76-R is represented in FIG. 31 by dashed lines. As shown, pixel definition layer 76-R partially overlaps anode 42-R and partially overlaps leakage-mitigating structure 70-R.

Leakage-mitigating structure 70-R does not completely surround anode 42-R. As shown, leakage-mitigating structure 70-R has an opening 414-R in at least one location around the perimeter of pixel 22-R (and anode 42-R and its corresponding light-emitting area). The leakage-mitigating structure 70-R therefore only partially surrounds the light-emitting aperture of pixel 22-R. Leakage-mitigating structure 70-R may extend around more than 50% of pixel 22-R (e.g., anode 42-R and its corresponding light-emitting area), more than 60% of pixel 22-R, more than 70% of pixel 22-R, more than 80% of pixel 22-R, more than 90% of pixel 22-R, more than 95% of pixel 22-R, etc. However, leakage-mitigating structure 70-R may extend around less than 100% of pixel 22-R (e.g., only partially encloses pixel 22-R).

The cathode 54 may be formed as a blanket layer over the pixels. Leakage-mitigating structure 70-R may cause discontinuity in the cathode. In other words, the cathode may have a discontinuity having the same footprint/outline as the leakage-mitigating structure 70-R. However, the cathode may be continuous through opening 414-R in the leakage-mitigating structure. Therefore, opening 414-R preserves the required cathode continuity for the pixel.

As shown in FIG. 31, anode 42-R may optionally have an extension 416-R (sometimes referred to as tab 416-R) that overlaps with opening 414-R in leakage-mitigating structure 70-R. Extension 416-R of anode 42-R may include an anode-contact where the anode is electrically connected to thin-film transistor circuitry in the underlying substrate 26.

Figure 32:
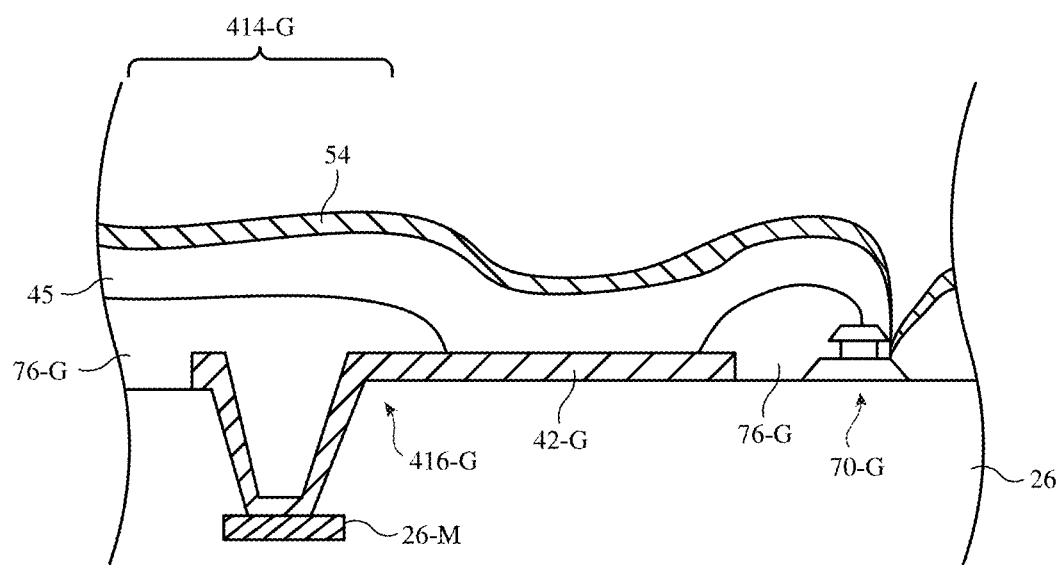
FIG. 32 is a cross-sectional side view of an illustrative display showing how cathode continuity is preserved in the opening of a leakage-mitigating structure in accordance with an embodiment.

The cross-sectional side view of FIG. 30 may be taken along line 418 in FIG. 31. FIG. 32 is a cross-sectional view along line 420 in FIG. 31. As shown in FIG. 32, discontinuities in OLED layers 45 and/or cathode layer 54 are caused by leakage-mitigating structure 70-G. However, in opening 414-G in leakage-mitigating structure 70-G, the cathode 54 (and OLED layers 45) are continuous. This allows the portion of cathode 54 over anode 42-G to be electrically connected to the rest of the cathode (e.g., through opening 414-G). FIG. 32 also shows how anode 42-G is electrically connected to an underlying thin-film transistor layer 26-M in substrate 26 through a via in the substrate 26. The via may be formed in an extension of anode 42-G that overlaps opening 414-G.

Figure 33:
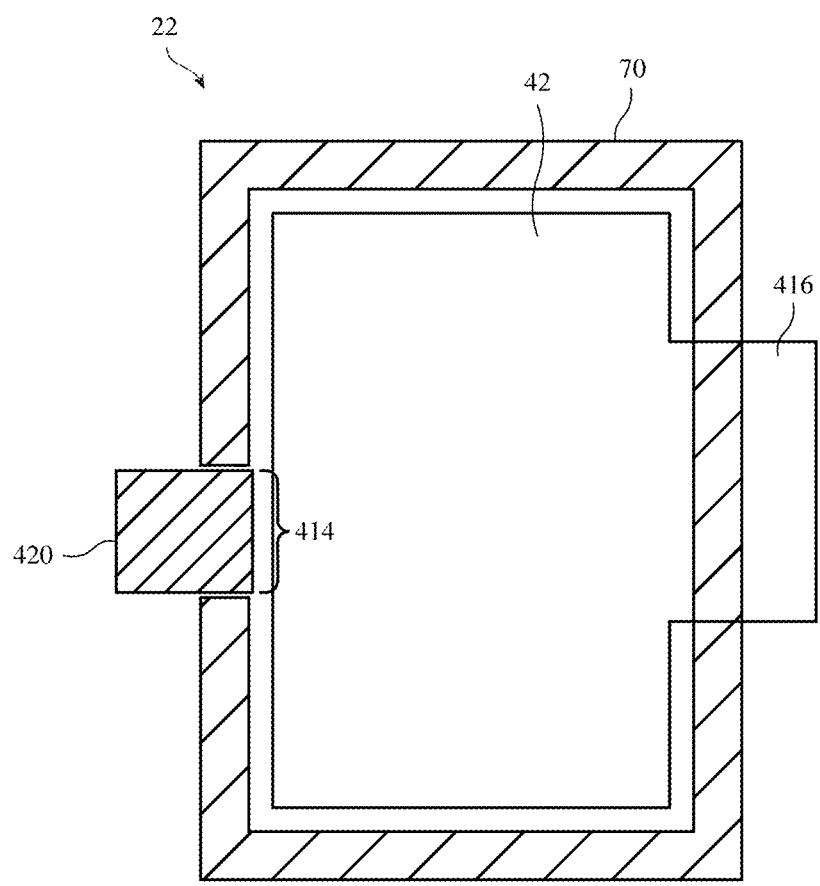
FIG. 33 is a top view of an illustrative display showing how an opaque layer may be formed in an opening in a leakage-mitigating structure that partially surrounds a respective anode in accordance with an embodiment.

The example in FIGS. 31 and 32 of the anode extensions 416 overlapping the leakage-mitigating structure openings 414 for each pixel is merely illustrative. If desired, as shown in FIG. 33, the anode extension 416 of a given pixel 22 may overlap with leakage-mitigating structure 70. In this example, the leakage-mitigating structure 70 may be formed on the metal for anode extension 416, on a pixel definition layer that overlaps anode extension 416, etc. With this type of arrangement, leakage-mitigating structure 70 may still have an opening 414 to preserve continuity of the cathode. However, the pixel may be susceptible to back emissions in opening 414. In other words, because no leakage-mitigating structure 70 is present in opening 414, light may be generated by pixel 22 in this region and/or may end up in this region due to reflections. The light may pass through the underlying substrate 26 and reach a through-display optical sensor, undesirably decreasing the signal-to-noise ratio of the sensor.

To mitigate these types of back emissions, an opaque layer 420 may be included that overlaps opening 414 in leakage-mitigating structure 70. Opaque layer 420 may be formed on an upper surface of substrate 26, may be embedded within substrate 26, may be formed on a lower surface of substrate 26, etc. The opaque layer may block back emissions from reaching an underlying sensor in the device through opening 414. The opaque layer may be a metal layer or dielectric layer. The opaque layer may be formed from a layer that is already present in the thin-film transistor circuitry in substrate 26 (e.g., a metal layer that is already used for contacts and/or signal routing within the substrate). Opaque layer 420 may have an opacity of greater than 80%, greater than 90%, greater than 95%, greater than 99%, etc.

As shown in the example of FIG. 31, in one possible arrangement, every pixel may have a corresponding leakage-mitigating structure 70 that partially surrounds the pixel. In other words, there is a 1:1 ratio between pixels and leakage-mitigating structures.

It should be noted that different pixels may have different associated OLED stackups with different OLED stackup thicknesses. Accordingly, the discontinuities caused by leakage-mitigating structure 70 may vary depending on the color of the pixel. In one possible embodiment, each color pixel may have a leakage-mitigating structure 70 that is optimized for its particular stackup. In other words, red pixels may have leakage-mitigating structures that partially surround the pixels and that have first dimensions, green pixels may have leakage-mitigating structures that partially surround the pixels and that have second dimensions, and blue pixels may have leakage-mitigating structures that partially surround the pixels and that have third dimensions that are different than the first and second dimensions. Each color's leakage-mitigating structure may be optimized for its particular OLED layers. This type of arrangement may, however, increase the manufacturing cost and complexity of the device. Therefore, to mitigate cost and complexity, in other embodiments every pixel may have a leakage-mitigating structure of the same dimensions (regardless of the color of the pixel).

Figure 34:
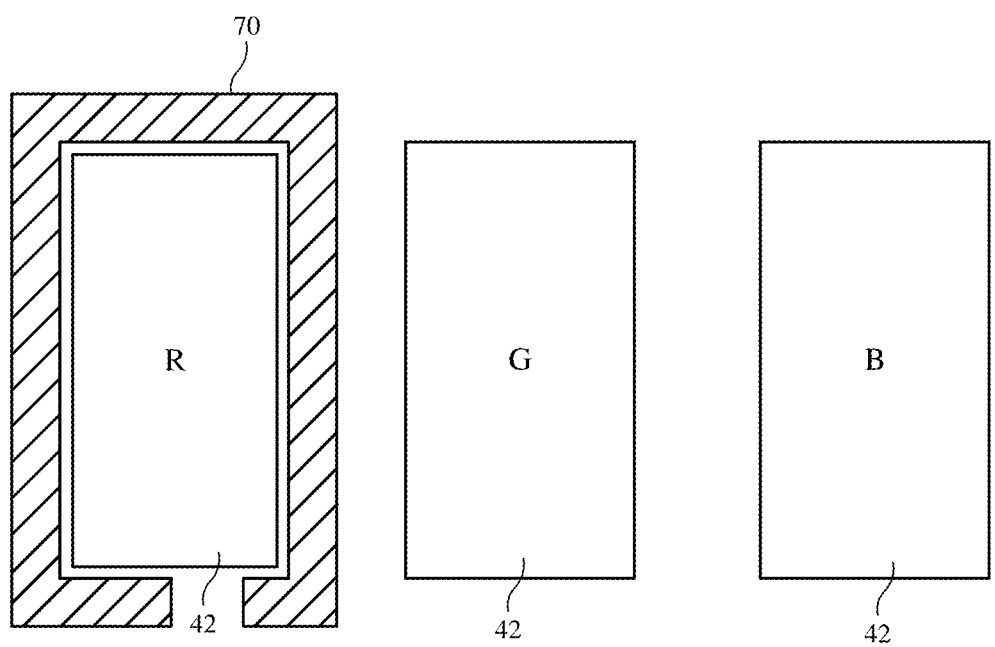
FIG. 34 is a top view of an illustrative display showing how only pixels of a given color may be partially surrounded by a respective leakage-mitigating structure in accordance with an embodiment.

In another example, shown in FIG. 34, only some pixels in the display may have an associated leakage-mitigating structure that partially surrounds the pixel. As shown in FIG. 34, the red pixel has an associated leakage-mitigating structure that partially surrounds the pixel but the green and blue pixels do not. This pattern may hold across the display. In other words, all of the red pixels in the display may have leakage-mitigating structures that partially surround the pixels while all of the green and blue pixels in the display may not have leakage-mitigating structures.

The example of only the red pixels having leakage-mitigating structures that partially surround the pixels is merely illustrative. In other embodiments, only the green pixels may have leakage-mitigating structures that partially surround the pixels or only the blue pixels may have leakage-mitigating structures that partially surround the pixels. As yet another possibility, any two pixel colors may have leakage-mitigating structures that partially surround the pixels while the remaining pixel color does not.

Displays of the type described herein may also sometimes have issues associated with IR drop across the cathode. As previously described, the cathode is formed as a blanket layer across the entire display. The cathode may have one or more contacts distributed around the periphery of the display to hold the cathode at a desired cathode voltage (ELVSS in FIG. 3). Ideally, the cathode would be held at the target voltage across the entire display. However, in practice, the resistance of the cathode causes a voltage drop across the display. To mitigate this issue, the cathode may be formed from a low-resistance material. However, in large displays, the cathode voltage drop may cause brightness variations and require increased power consumption (even when a low-resistance material is used for the cathode).

To mitigate the non-uniformity and power consumption issues caused by cathode IR drop, the display may include cathode bus lines that are electrically connected to the cathode for each pixel. This reduces the IR drop for the cathode across the display, ensures the cathode is held at a consistent voltage for each pixel, and mitigates brightness non-uniformities associated with cathode IR drop.

Figure 35:
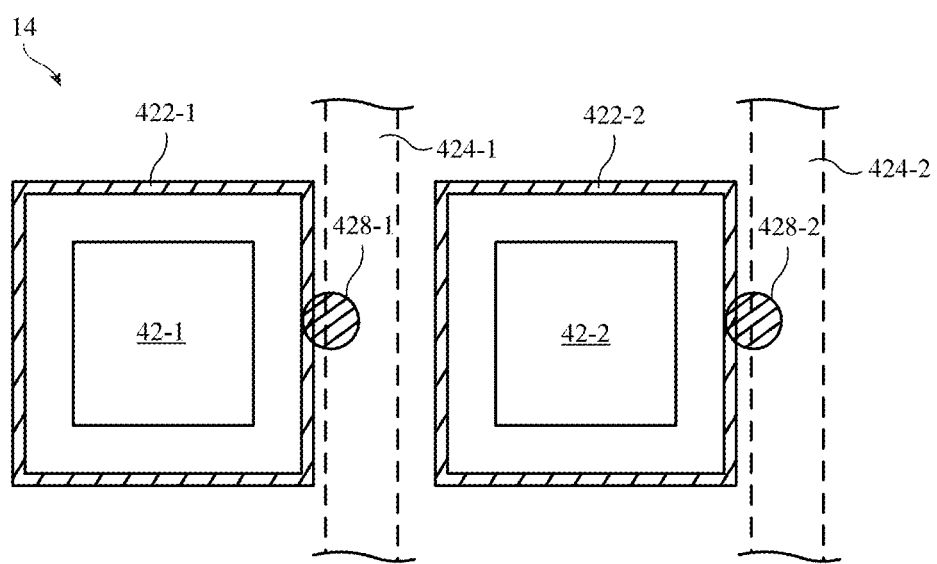
FIG. 35 is a top view of an illustrative display that includes cathode bus lines in accordance with an embodiment.

FIG. 35 is a top view of an illustrative display that includes cathode bus lines 424. As shown in FIG. 35, a first cathode bus line 424-1 may extend adjacent to a first column of pixels and a second cathode bus line 424-2 may extend adjacent to a second column of pixels. Bus lines 424 may be incorporated into thin-film transistor substrate 26 (e.g., on an outer surface of substrate 26, embedded within substrate 26, etc.). Each bus line may be formed from a low-resistance material and may be held at cathode voltage ELVSS.

The cathode may be formed as a blanket layer over the entire display. Accordingly, the cathode is not explicitly labeled in FIG. 35, since the cathode layer covers all of the components in FIG. 35. Surrounding each pixel is an undercut structure 422 that causes a discontinuity in the cathode. As shown, undercut structure 422-1 completely surrounds respective anode 42-1 whereas undercut structure 422-2 completely surrounds respective anode 42-2. Each undercut structure may cause a discontinuity in the cathode layer and the OLED layers for the display. Accordingly, the undercut creates a cathode 'island' over each pixel. In other words, each pixel is covered by a discrete portion of the cathode layer that is separated from the remaining portions of the cathode layer by the discontinuity caused by undercut structure 422.

To electrically connect each cathode layer island to the desired cathode voltage, each cathode layer island is electrically connected to a respective bus line 424. As shown in FIG. 35, the cathode layer portion over anode 42-1 is electrically connected to a contact pad 428-1, which is in turn electrically connected to bus line 424-1. The cathode layer portion over anode 42-2 is electrically connected to a contact pad 428-2, which is in turn electrically connected to bus line 424-2.

An intervening conductive layer may be used to electrically connect each cathode layer island to contact pads 428. The intervening conductive layer may be, for example, formed from a blanket layer of transparent conductive material. The intervening conductive layer may be formed from a transparent metal oxide such as indium tin oxide (ITO) or indium zinc oxide (IZO).

Figure 36:
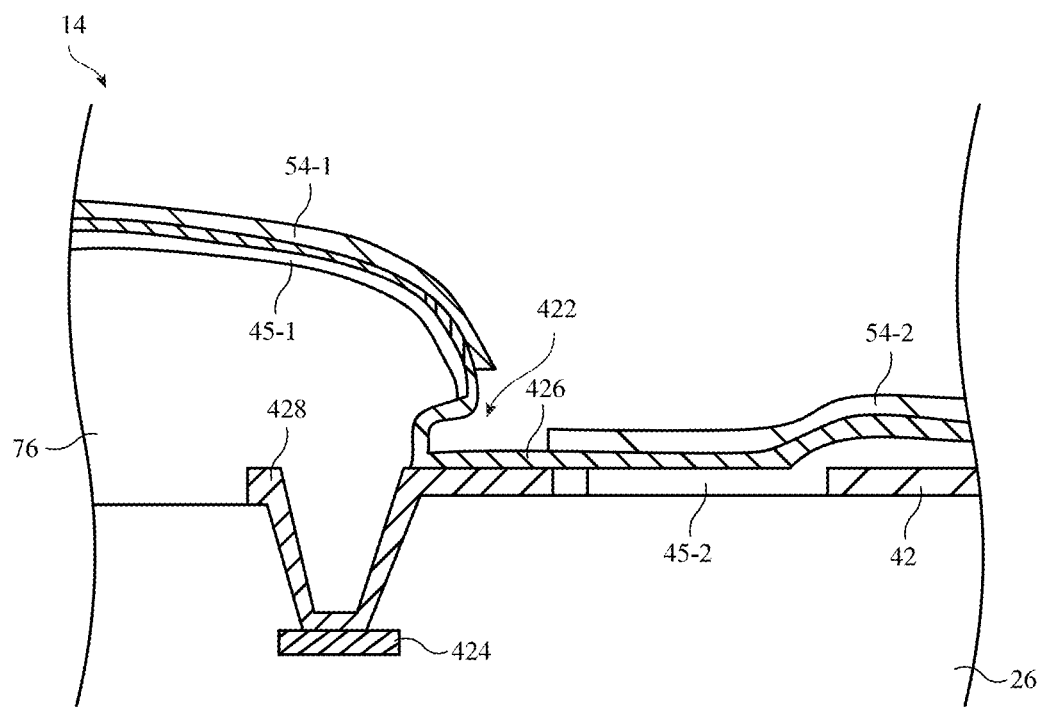
FIG. 36 is a cross-sectional side view of an illustrative display that has an undercut structure and a conductive layer that electrically connects the cathode to a cathode bus line in accordance with an embodiment.

FIG. 36 is a cross-sectional side view of an illustrative undercut structure that causes a discontinuity in the cathode layer. As shown in FIG. 36, undercut structure 422 may be formed in or adjacent to pixel definition layer 76. The undercut structure causes OLED emissive layers 45 to be separated into two discrete segments: OLED layers 45-1 and OLED layers 45-2. OLED layers 45-2 may extend over anode 42 and form part of the light-emitting pixel. OLED layers 45-1 are separated from OLED layers 45-2 by undercut structure 422. Separating OLED layers 45-1 and 45-2 may mitigate lateral leakage current, as previously discussed.

The undercut structure 422 also causes cathode layer 54 to be separated into two discrete segments: cathode layer portion 54-1 and cathode layer portion 54-2. Cathode layer portion 54-2 may extend over anode 42 and form part of the light-emitting pixel. Cathode layer portion 54-1 is separated from cathode layer portion 54-2 by undercut structure 422.

To ensure electrical connection between cathode layer portions 54-1 and 54-2 (despite the discontinuity from undercut structure 422), conductive layer 426 is included in the display. As shown in FIG. 36, conductive structure 426 (sometimes referred to as conductive bridge 426) may be formed from a blanket layer of transparent conductive material. The conductive layer may be formed from a transparent metal oxide such as indium tin oxide (ITO) or indium zinc oxide (IZO).

Conductive layer 426 electrically connects cathode layer portion 54-2 to cathode bus line 424. As shown, conductive layer 426 is adjacent to and in direct contact with both cathode layer portion 54-2 and contact pad 428. Contact pad 428 is in direct contact with (and electrically connects) conductive layer 426 and cathode bus line 424. Therefore, cathode layer 54-2 is provided the appropriate cathode voltage from bus line 424 (using intervening contact 428 and conductive layer 426).

Contact pad 428 may be formed from the same layer as anode 42. In other words, contact pad 428 and anode 42 may be formed from the same material during a single deposition/patterning step. This example is merely illustrative. Contact pad 428 and anode 42 may be formed from different materials if desired.

Because the distance between bus line 424 and cathode layer portion 54-2 is short, IR drop is minimized. The distance is sufficiently short that conductive layer 426 may have a higher resistance than cathode layer 54. Even if the conductive layer 426 has a relatively high resistance (e.g., higher than layer 54), the IR drop caused by conductive layer 426 over the short distance between contact pad 428 and cathode layer portion 54-2 does not significantly impact the pixel performance.

For ease of manufacturing, conductive layer 426 may be formed as a blanket layer across the entire pixel array (e.g., like cathode layer 54). This example is merely illustrative. Alternatively, conductive layer 426 may be patterned to be present only in locations necessary to bridge the gap between discrete cathode layer portions (e.g., portions 54-1 and 54-2 in FIG. 36) and/or in locations necessary to electrically connect the cathode layer to bus lines 424 via contact pads 428.

To ensure high step-coverage (such that the conductive layer conforms to undercut structure 422 and electrically connects adjacent cathode layer portions), conductive layer 426 may be deposited using atomic layer deposition (ALD) at a low temperature (e.g., less than 100 degrees Celsius). This example is merely illustrative. Conductive layer 426 may be formed using other manufacturing techniques if desired.

It should be noted that the example in FIGS. 35 and 36 of undercut structure 422 being included in addition to bus lines 424 and contact pad 428/conductive layer 426 is merely illustrative. In another possible arrangement, the undercut structure 422 may be omitted. However, bus lines 424 may still be used to mitigate IR drop in the cathode. In this type of arrangement, contact pad 428 and conductive layer 426 may still be used to electrically connect bus lines 424 to cathode layer 54.

Figure 37:
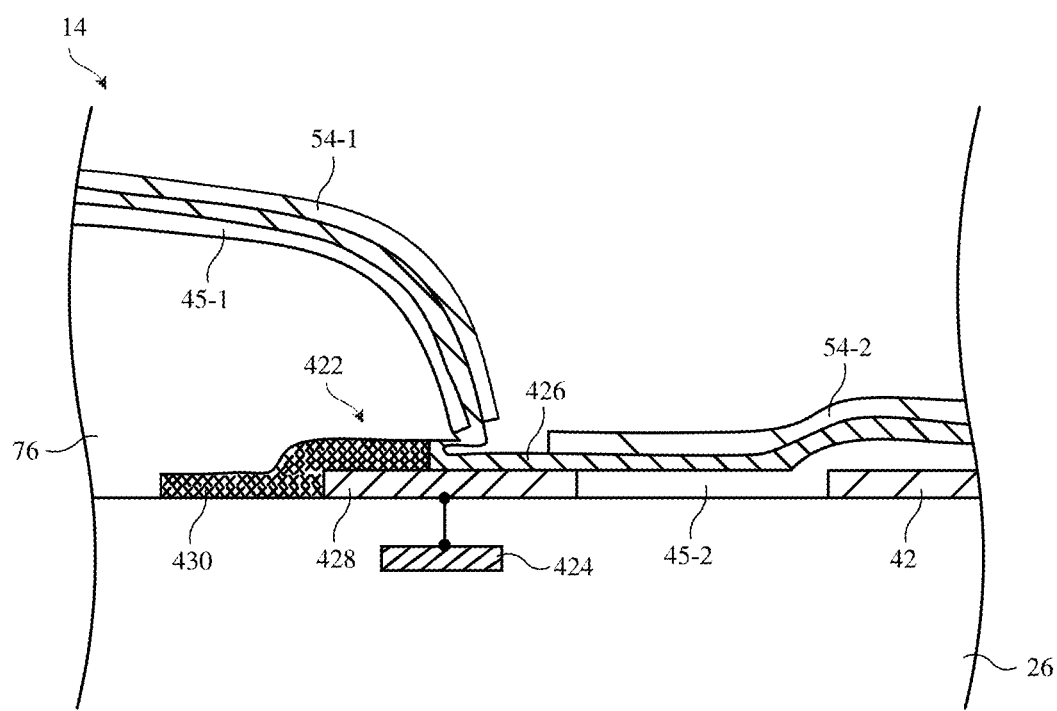
FIG. 37 is a cross-sectional side view of an illustrative display that has a single-layer undercut structure in accordance with an embodiment.

There are many ways to form undercut structure 422 to cause discontinuity in the OLED and/or cathode layers. Any of the leakage-mitigating structures 70 shown in connection with FIGS. 6-9 may be used. In general, the undercut structure 422 may include one layer, two layers, three layers, more than three layers, etc. FIG. 37 is a cross-sectional side view of an illustrative display where the undercut structure includes one layer 430 that conforms to the edge of contact pad 428. Layer 430 may be formed from a metal material (e.g., molybdenum, copper, etc.) or a dielectric material (e.g., silicon oxide, silicon nitride, etc.). Pixel definition layer 76 may overhang layer 430 to define an undercut (void) that causes discontinuities in OLED layers 45 and cathode layer 54.

Figure 38:
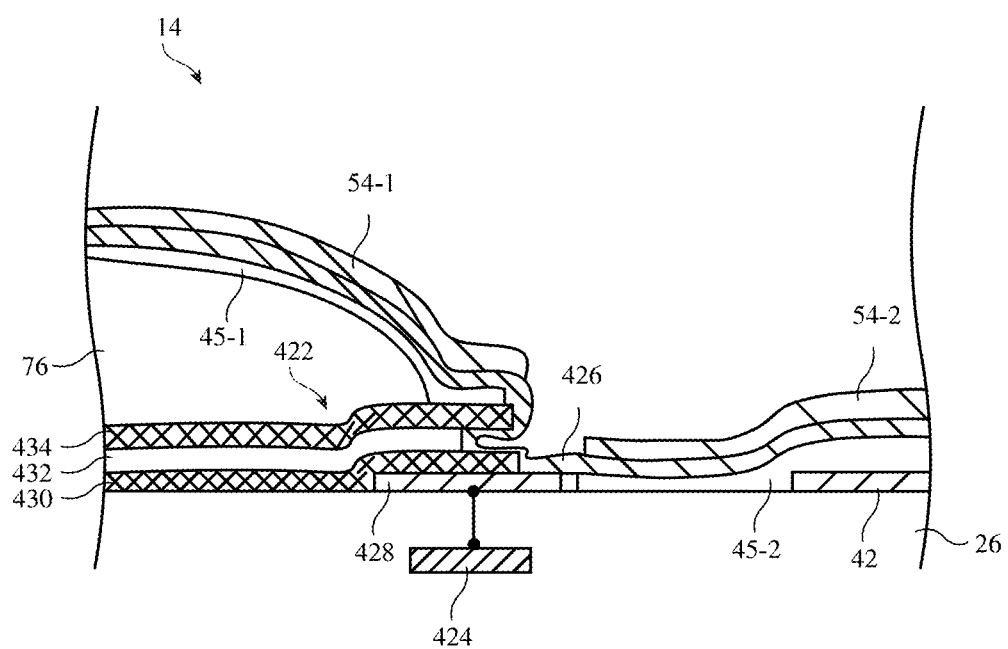
FIG. 38 is a cross-sectional side view of an illustrative display that has a three-layer undercut structure in accordance with an embodiment.

FIG. 38 is a cross-sectional side view of an illustrative display where the undercut structure includes three layers. A first layer 430 conforms to the edge of contact pad 428. A second layer 432 is formed over layer 430 and conforms to layer 430. A third layer 434 is formed over layer 432 and conforms to layer 432. Each one of layers 430, 432, and 434 may be formed from a metal material (e.g., molybdenum, copper, etc.) or a dielectric material (e.g., silicon oxide, silicon nitride, etc.). Pixel definition layer 76 may be formed on layer 434. Layer 434 may overhang layer 432 to define an undercut (void) that causes discontinuities in OLED layers 45 and cathode layer 54. If desired, one of the three layers (e.g., layer 430) may be omitted and a two-layer undercut structure may be used.

Figure 39:
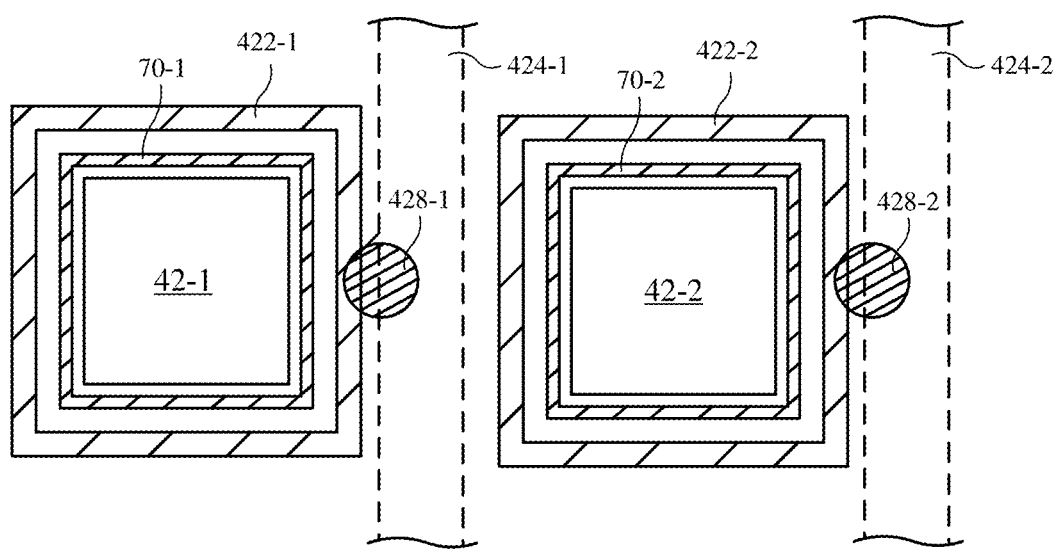
FIG. 39 is a top view of an illustrative display that includes a leakage-mitigating structure and an additional undercut structure in accordance with an embodiment.

In FIG. 35, each pixel includes an undercut structure that laterally surrounds a corresponding anode. The undercut structure forms a ring around the anode and therefore may sometimes be referred to as an undercut ring. In addition to an undercut ring, each pixel may also include a leakage-mitigating structure 70 that also forms a ring around the anode. FIG. 39 is a top view of an illustrative display where each pixel includes a leakage-mitigating structure 70 and an additional undercut structure 422.

As shown in FIG. 39, a first cathode bus line 424-1 may extend adjacent to a first column of pixels and a second cathode bus line 424-2 may extend adjacent to a second column of pixels. The cathode may be formed as a blanket layer over the entire display. Accordingly, the cathode is not explicitly labeled in FIG. 39, since the cathode layer covers all of the components in FIG. 39.

Surrounding each pixel is a leakage-mitigating structure that causes a discontinuity in at least one of the OLED layers 45 for that pixel. As shown, leakage-mitigating structure 70-1 completely surrounds anode 42-1 and leakage-mitigating structure 70-2 completely surrounds anode 42-2. Each leakage-mitigating structure may mitigate lateral leakage from the OLED layers (e.g., using any of the passive or active structures previously discussed).

Additionally, surrounding each pixel is an undercut structure 422 that causes a discontinuity in the cathode. As shown, undercut structure 422-1 completely surrounds respective leakage-mitigating structure 70-1 and anode 42-1 whereas undercut structure 422-2 completely surrounds respective leakage-mitigating structure 70-2 and anode 42-2. Each undercut structure 422 may cause a discontinuity in the cathode layer and the OLED layers for the display. Accordingly, the undercut creates a cathode 'island' over each pixel. In other words, each pixel is covered by a discrete portion of the cathode layer that is separated from the remaining portions of the cathode layer by the discontinuity caused by undercut structure 422. Each cathode layer island is electrically connected to a respective bus line using the techniques previously discussed (e.g., using a conductive bridging layer 426 and a contact pad 428).

Figure 40:
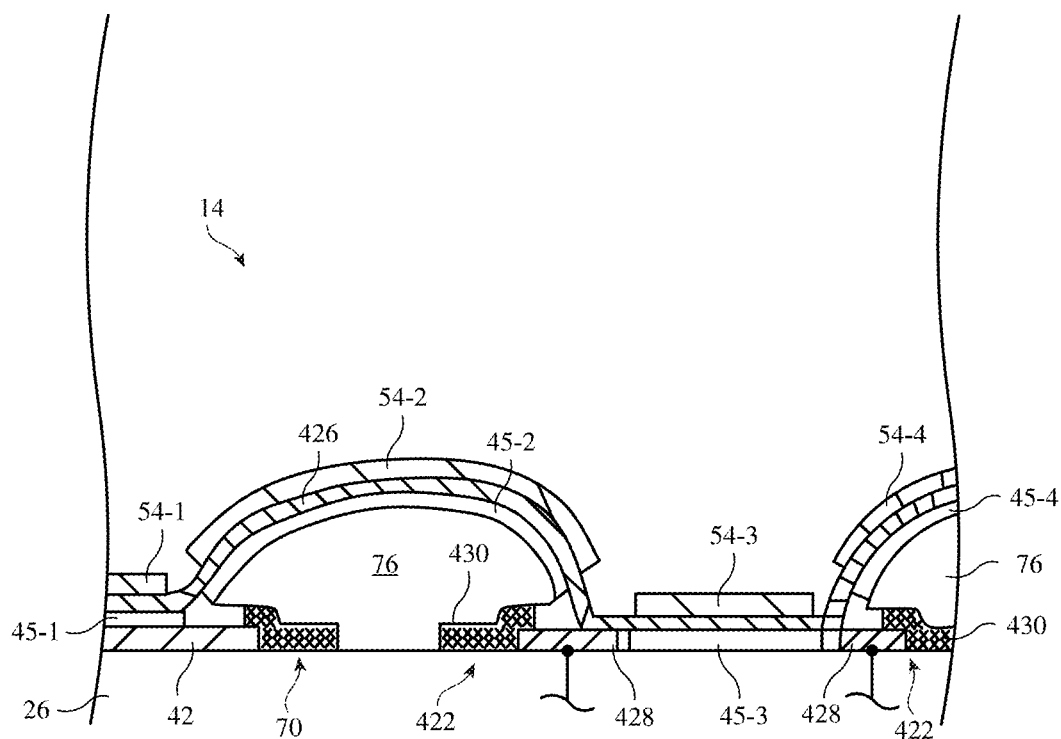
FIG. 40 is a cross-sectional side view of an illustrative display that has a leakage-mitigating structure and an additional single-layer undercut structure in accordance with an embodiment.

FIG. 40 is a cross-sectional side view of an illustrative display with a leakage-mitigating structure 70 and an undercut structure 422. As shown in FIG. 40, leakage-mitigating structure 70 is formed adjacent to (and conforms to) anode 42. In FIG. 40, leakage-mitigating structure 70 is a passive leakage-mitigating structure that includes an undercut to cause discontinuities in at least some of the overlying layers. Leakage-mitigating structure 70 causes a discontinuity in OLED layers 45 to form electrically disconnected layers 45-1 and 45-2. Leakage-mitigating structure 70 may also cause a discontinuity in cathode layer 54 to form electrically disconnected cathode layer portions 54-1 and 54-2. This example is merely illustrative. Cathode layer 54 may maintain continuity over leakage-mitigating structure 70 if desired.

Blanket conductive layer 426 is formed across the entire display. A first ring of pixel definition layer 76 (sometimes referred to as an inner ring) may be formed between the leakage-mitigating structure ring and the undercut structure ring (see FIG. 39). As shown on the right of FIG. 40, a second ring of pixel definition layer 76 (sometimes referred to as an outer ring) may be formed adjacent the undercut structure ring. A first undercut structure 422 is formed in the inner pixel definition layer ring. The undercut structure may include a single layer 430 that conforms to contact pad 428 (that is electrically connected to a cathode bus line). The first undercut structure 422 causes a discontinuity in OLED layers 45 to form electrically disconnected layers 45-2 and 45-3. The first undercut structure 422 may also cause a discontinuity in cathode layer 54 to form electrically disconnected cathode layer portions 54-2 and 54-3.

If desired, the undercut structure ring may include a second undercut structure in addition to the first undercut structure. The second undercut structure may be formed in a ring around the first undercut structure. As shown in FIG. 40, the second undercut structure 422 may be formed in the outer ring of pixel definition layer 76. The undercut structure may include a single layer 430 that conforms to contact pad 428 (that is electrically connected to a cathode bus line). The second undercut structure 422 causes a discontinuity in OLED layers 45 to form electrically disconnected layers 45-3 and 45-4. The second undercut structure 422 may also cause a discontinuity in cathode layer 54 to form electrically disconnected cathode layer portions 54-3 and 54-4.

The first and second contact pads 428 in FIG. 40 may be electrically connected to the same cathode bus line or to different cathode bus lines.

The undercut of leakage-mitigating structure 70 may have the same structure as undercut structures 422 or a different structure than undercut structures 422. In some arrangements, leakage-mitigating structure 70 may have an undercut with a smaller height than undercut structures 422 (to cause less discontinuity in the overlying layers). Similarly, the first and second undercut structures 422 in FIG. 40 may have the same structure or may have different structures. In FIG. 40, the undercut structures 422 have the same height. However, in an alternate arrangement, shown in FIG. 41, the undercut structures 422 have different heights.

Figure 41:
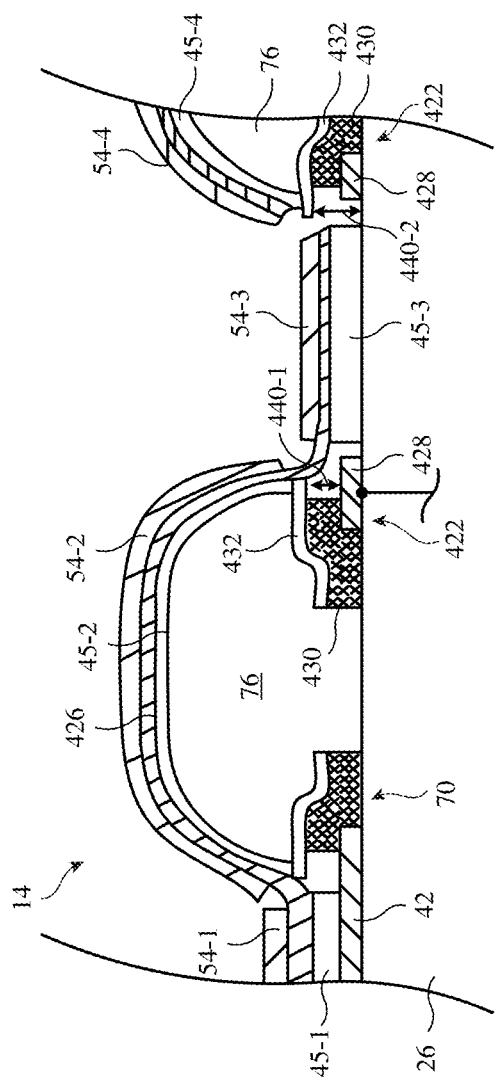
FIG. 41 is a cross-sectional side view of an illustrative display that has a leakage-mitigating structure and an additional two-layer undercut structure in accordance with an embodiment.

As shown in the cross-sectional side view of FIG. 41, the first undercut structure has a first height 440-1 (defined by a lower surface of layer 432 and an upper surface of contact pad 428). The second undercut structure has a second height 440-2 (defined by a lower surface of layer 432 and an upper surface of substrate 26) that is greater than the first height. To make the second height 440-2 greater than the first height, contact pad 428 may be shifted or reduced in size so that the overhang of layer 432 is formed over substrate 26 instead of the contact pad.

FIG. 41 also demonstrates how each undercut structure may be formed from two layers instead of one layer (as in FIG. 40). The undercut structure may instead have three layers or any other desired structure.

An arrangement of the type shown in FIG. 41, where first and second undercut structures with different dimensions are used, may be referred to as asymmetrical. In general, each undercut structure may have any desired dimensions, may be formed from any desired number of layers, etc. The second undercut structure in FIG. 41 causes a discontinuity in conductive layer 426. This may further reduce lateral leakage for the pixel. However, this example is merely illustrative. The undercut structure may preserve continuity of one or more OLED layers 45, conductive layer 426, and/or cathode 54 if desired.

It should be noted that the example in FIGS. 35 and 39 of each cathode bus line running parallel to a respective column of pixels is merely illustrative. Alternatively, each cathode bus line may run parallel to a respective row of pixels. Additionally, the discontinuities in the cathode layer may be leveraged to provide different cathode voltages to different pixels using the bus lines if desired. The cathodes for each pixel may only be electrically connected to a single bus line, so per-pixel, per-row, or per-column cathode voltage control is possible. For example, a first bus line may provide a first cathode voltage to a first column of pixels and a second bus line may provide a second cathode voltage to a second column of pixels. The first and second cathode voltages may have different magnitudes.

Figure 42:
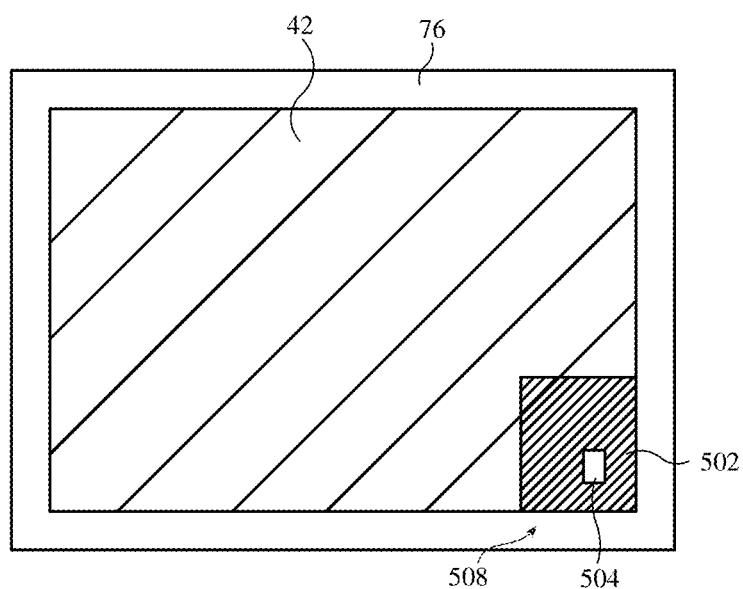
FIG. 42 is a top view of an illustrative pixel with a conductive liner in a corner portion that has an anode contact in accordance with an embodiment.

FIG. 42 is a top view of an illustrative pixel having an anode contact with a liner. As shown, anode 42 may be covered by pixel definition layer 76. Pixel definition layer 76 defines an aperture through which the pixel emits light. Pixel definition layer 76 extends around a periphery of anode 42 and covers a corner portion 508 of the anode 42. Corner portion 508 may include an anode contact area 504 that electrically connects anode 42 to a metal layer within the substrate.

The corner portion 508 with the anode contact may have a high risk for undesired lateral leakage during operation of the pixel. To mitigate lateral leakage in this region, conductive liner 502 is included in the pixel. The conductive liner 502 may electrically connect anode 42 to the metal layer in the substrate. The conductive liner 502 increases the thickness of the pixel definition layer 76. This increased thickness may improve the discontinuity of a laterally conductive layer in the OLED pixel, thereby mitigating lateral leakage.

Figure 43:
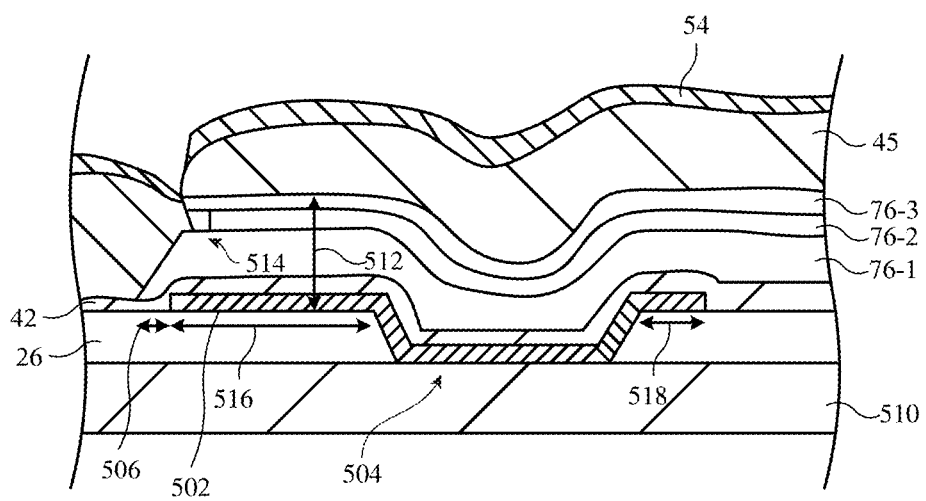
FIG. 43 is a cross-sectional side view of an illustrative pixel with a conductive liner in a corner portion that has an anode contact in accordance with an embodiment.

FIG. 43 is a cross-sectional side view showing the corner portion 508 of the pixel of FIG. 42. As shown, anode 42 is formed on substrate 26. Substrate 26 includes a via in contact area 504 to allow electrical connection between anode 42 and metal layer 510 within the substrate. Metal layer 510 may provide a desired voltage to anode 42 and may sometimes be referred to as anode portion 510.

Conductive liner 502 is patterned on substrate 26 to fill the via and electrically connect to metal layer 510. Conductive liner 502 may improve reliability and contact resistance for the anode contact. Conductive liner 502 may be formed from a different material than anode 42. Conductive liner 502 may have a thickness of less than 100 nanometers, less than 60 nanometers, less than 40 nanometers, less than 30 nanometers, greater than 10 nanometers, between 10 and 50 nanometers, etc.

Pixel definition layer 76 includes three respective layers 76-1, 76-2, and 76-3 (e.g., having a structure similar to structures 70-1, 70-2, and 70-3 in FIG. 9, having a structure similar to structures 430, 432, and 434 in FIG. 38, etc.) that define an undercut 514. The undercut defined by layers 76-1, 76-2, and 76-3 creates a discontinuity in OLED layers 45, thereby reducing lateral leakage. Layers 76-1, 76-2, and 76-3 may sometimes be collectively referred to as a leakage mitigating structure.

To improve the lateral leakage mitigation in the pixel in the corner adjacent to the anode contact, conductive liner 502 extends close to the edge of pixel definition layer 76. This increases the effective height 512 of the pixel definition layer 76 in the region with the undercut 514. The increased effective height of the pixel definition layer (caused by the conductive liner 502) improves the discontinuity in OLED layers 45 (e.g., increases a gap between two portions of a laterally conductive layer) to mitigate lateral leakage. Undercut 514 may vertically overlap conductive liner 502. The edge of conductive liner 502 (e.g., the edge adjacent to the light-emitting area of the pixel) and the edge of pixel definition layer 76 (e.g., the edge adjacent to the light-emitting area of the pixel) may be separated by a distance 506. Distance 506 may be less than 100 nanometers, less than 60 nanometers, less than 40 nanometers, less than 30 nanometers, less than 20 nanometers, less than 10 nanometers, less than 5 nanometers, less than 3 nanometers, etc.

The increased effective height of pixel definition layer 76 may result in a discontinuity in cathode 54 in corner portion 508 of the pixel. However, even if this discontinuity is present, the discontinuity is isolated to the corner portion of the pixel and the cathode is continuous around the rest of the periphery of the pixel. Therefore, even if the cathode is disconnected in the corner portion, the overall performance of the display will not be substantially affected.

As shown in FIGS. 42 and 43, the conductive liner 502 may have a first portion on substrate 26 between the via and the light-emitting area that has a first width 516. The conductive liner 502 may have a second portion on substrate 26 between the via and the periphery of the pixel that has a second width 518. The second width may be smaller than the first width. In other words, the via (and corresponding contact area between liner 502 and metal layer 510) is not centered relative to the overall footprint of the conductive liner. Width 518 may be less than 80% of width 516, may be less than 60% of width 516, may be less than 40% of width 516, may be less than 20% of width 516, etc.

The foregoing is merely illustrative and various modifications can be made by those skilled in the art without departing from the scope and spirit of the described embodiments. The foregoing embodiments may be implemented individually or in any combination.

What is claimed is:

1. A display comprising:
   a substrate;
   an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
   a pixel definition layer on the substrate that is interposed between the first and second patterned electrodes;
   a conductive layer formed over the substrate that has a first portion that forms part of the first organic light-emitting diode pixel and a second portion that forms part of the second organic light-emitting diode pixel; and
   a leakage-mitigating structure that is formed between the first patterned electrode and the pixel definition layer, wherein the leakage-mitigating structure has a recess that causes a discontinuity in the conductive layer, wherein the leakage-mitigating structure has a first portion formed from a first material, a second portion formed from a second material that is different than the first material, and a third portion formed from the first material, wherein the second portion is interposed between the first portion and the third portion, and wherein the first, second, and third portions overlap in a direction orthogonal to a top surface of the substrate.

2. The display defined in claim 1, wherein the pixel definition layer is formed from an organic material and wherein the leakage-mitigating structure is formed from at least one inorganic material.

3. The display defined in claim 1, wherein the leakage-mitigating structure has first and second opposing surfaces, wherein the first surface is in direct contact with the first patterned electrode, and wherein the second surface is in direct contact with the pixel definition layer.

4. The display defined in claim 1, wherein the leakage-mitigating structure has an edge and wherein the pixel definition layer is set back at least 0.5 microns from the edge.

5. The display defined in claim 1, wherein the first portion of the leakage-mitigating structure extends past an edge of the second portion of the leakage-mitigating structure to define the recess in the leakage-mitigating structure.

6. The display defined in claim 5, wherein the third portion of the leakage-mitigating structure extends past an edge of the first portion of the leakage-mitigating structure.

7. The display defined in claim 1, wherein the first patterned electrode has an upper surface and a sidewall surface and wherein the leakage-mitigating structure conforms to and covers the sidewall surface.

8. The display defined in claim 1, wherein the first and second patterned electrodes are first and second anodes, wherein the display further comprises a cathode that forms a portion of both the first and second organic light-emitting diode pixels, and wherein the cathode extends without any discontinuities between the first and second organic light-emitting diode pixels.

9. The display defined in claim 1, wherein the leakage-mitigating structure is a ring that encloses the first organic light-emitting diode pixel.

10. The display defined in claim 1, wherein each pixel has a respective leakage-mitigating structure that is formed in a ring around that pixel.

11. The display defined in claim 1, wherein the array of pixels includes pixels of a first color, pixels of a second color, and pixels of a third color and wherein the pixels of only the first color are enclosed by respective leakage-mitigating structures.

12. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a conductive layer formed over the substrate that has a first portion that forms part of the first organic light-emitting diode pixel and a second portion that forms part of the second organic light-emitting diode pixel;
a first leakage-mitigating structure that is formed between the first patterned electrode and the second patterned electrode, wherein the first leakage-mitigating structure has a first recess that causes a discontinuity in the conductive layer, wherein the first recess faces a first direction, wherein the first leakage-mitigating structure partially surrounds the first patterned electrode but does not completely surround the first patterned electrode, and wherein the first leakage-mitigating structure has an opening that causes the leakage-mitigating structure to not completely surround the first patterned electrode;
a second leakage-mitigating structure that is formed between the first patterned electrode and the second patterned electrode, wherein the second leakage-mitigating structure has a second recess that causes a second discontinuity in the conductive layer and wherein the second recess faces a second direction opposite the first direction; and
a common electrode that is formed over the conductive layer, wherein the first organic light-emitting diode pixel includes a first portion of the common electrode, wherein the second organic light-emitting diode pixel includes a second portion of the common electrode, wherein the first and second recesses in the first and second leakage-mitigating structures cause electrical discontinuities in the common electrode, and wherein the first portion of the common electrode is electrically connected to a remaining portion of the common electrode through the opening; and
a pixel definition layer, wherein a first portion of the pixel definition layer is interposed between the first leakage-mitigating structure and the first patterned electrode, wherein a second portion of the pixel definition layer is interposed between the second leakage-mitigating structure and the second patterned electrode, and wherein the pixel definition layer is omitted between the first and second leakage-mitigating structures.

13. The display defined in claim 12, wherein the first patterned electrode is adjacent to the second patterned electrode.

14. The display defined in claim 12, wherein the first recess faces the second recess.

15. A display comprising:
a substrate that includes a bus line;
an array of pixels that includes an organic light-emitting diode pixel, wherein the organic light-emitting diode pixel includes a first electrode on the substrate and a second electrode that is formed over the first electrode;
a conductive layer formed over the substrate that has a portion that forms part of the organic light-emitting diode pixel;
an undercut structure that causes a first electrical discontinuity between first and second portions of the second electrode and a second electrical discontinuity between first and second portions of the conductive layer, wherein the first portion of the second electrode and the first portion of the conductive layer form part of the organic light-emitting diode pixel and wherein the undercut structure extends in a ring around the organic light-emitting diode pixel;
a leakage-mitigating structure that extends in an additional ring around the organic light-emitting diode pixel, wherein the leakage-mitigating structure is interposed between the first electrode and the undercut structure; and
a transparent conductive layer that is electrically connected between the first portion of the second electrode and the bus line.

16. The display defined in claim 15, further comprising:
a contact pad that is electrically connected to the bus line, wherein the transparent conductive layer electrically connects the first portion of the second electrode to the contact pad.

17. The display defined in claim 15, wherein the first electrode is an anode and wherein the second electrode is a cathode.

18. A display comprising:
a substrate that includes a via;
a metal layer in the substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a conductive layer formed over the substrate that has a first portion that forms part of the first organic light-emitting diode pixel and a second portion that forms part of the second organic light-emitting diode pixel;
a conductive liner that electrically connects the first patterned electrode to the metal layer through the via; and
a leakage-mitigating structure that is formed adjacent to the first patterned electrode, wherein the leakage-mitigating structure has a recess that causes a discontinuity in the conductive layer, wherein the leakage-mitigating structure has an edge, and wherein the conductive liner is set back from the edge.

19. The display defined in claim 18 wherein the recess vertically overlaps the conductive liner.

* * * * *